(12) United States Patent
Abutalebi et al.

(10) Patent No.: US 7,783,032 B2
(45) Date of Patent: Aug. 24, 2010

(54) METHOD AND SYSTEM FOR PROCESSING SUBBAND SIGNALS USING ADAPTIVE FILTERS

(75) Inventors: Hamid Reza Abutalebi, Yazd (IR); Robert L. Brennan, Kitchener (CA); Hamid Sheikhzadeh-Nadjar, Waterloo (CA); Dequn Sun, Neuchatel (CH)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1478 days.

(21) Appl. No.: 10/642,847

(22) Filed: Aug. 18, 2003

(65) Prior Publication Data
US 2004/0071284 A1 Apr. 15, 2004

(30) Foreign Application Priority Data
Aug. 16, 2002 (CA) .................................. 2399159

(51) Int. Cl.
*H04M 9/08* (2006.01)
(52) U.S. Cl. ....................... 379/406.09; 379/406.14
(58) Field of Classification Search ................ 381/94.1; 379/406.09, 406.14
See application file for complete search history.

(56) References Cited

U.S. PATENT DOCUMENTS

| 5,267,266 | A | 11/1993 | Chen ........................... 375/14 |
| 5,329,587 | A | 7/1994 | Morgan et al. ............... 379/410 |
| 6,023,295 | A | 2/2000 | Pau |
| 6,236,731 | B1 | 5/2001 | Brennan et al. ............. 381/316 |
| 6,240,192 | B1* | 5/2001 | Brennan et al. ............. 381/314 |
| 6,246,760 | B1* | 6/2001 | Makino et al. ......... 379/406.08 |
| 6,862,326 | B1* | 3/2005 | Eran et al. .................. 375/343 |

OTHER PUBLICATIONS

Andre Gilloire, et al., "Adaptive Filtering in Subbands with Critical Sampling: Analysis, Experiments, and Application to Acoustic Echo Cancellation", 8084 IEEE Transactions on Signal Processing 40(Aug. 1992), No. 8, New York, pp. 1862-1865.
Wai Pang Ng, et al., "Parallel DAF Measurement Device (PDMD) for Non-Intrusive Whitening of Speech", 2001 IEEE International Conference on Communications, New York, vol. 1 of 10, Jun. 11, 2001, pp. 1052-1056.
Q.G., Liu, et al., "On The Use Of A Modified Fast Affine Projection Algorithm In Subbands For Acoustic Echo Cancelation", Proc. IEEE 1996 Digital Signal Processing Workshop, Sep. 1, 1996, pp. 354-357.

(Continued)

*Primary Examiner*—Alexander Jamal

(57) ABSTRACT

A method and system for processing subband signals using adaptive filters is provided. The system is implemented on an oversampled WOLA filterbank. Inputs signals are oversampled. The system includes an adaptive filter for each subband, and the functionality of improving the convergence properties of the adaptive filter. For example, the convergence property is improved by whitening the spectra of the oversampled subband signals and/or affine projection algorithm. The system is applicable to echo and/or noise cancellation. Adaptive step size control, adaptation process control using Double-Talk detector may be implemented. The system may further implement a non-adaptive processing for reducing uncorrelated noise and/or cross-talk resistant adaptive noise cancellation.

24 Claims, 32 Drawing Sheets

OTHER PUBLICATIONS

T. Gansler, et al., "Double-Talk Robust Fast Converging Algorithms For Network Echo Cancellation", Applications of Signal Processing to Audio and Acoustics, 1999 IEEE Workshop, New Paltz, New York, Oct. 17-20, 1999, pp. 215-218.

M.R. Petraglia, et al., "Performance Comparisons Of Two Adaptive Subband Structures", Circuits and Systems, 1995. Proceedings of the 38th Midwest Symposium, Rio De Janeiro, Brazil, Aug. 13-16, 1995, pp. 235-238.

Ozeki Kazuhiko et al, "An Adaptive Filtering Algorithm Using An Orthogonal Projection To An Affine Subspace And Its Properties", electronics and Communications in Japan, New York, vol. 67-A, No. 5, May 1, 1984, pp. 19-27.

R.G. Alves, et al., "RLS Algorithm For A New Subband Adaptive Structure With Critical Sampling", Telecommunications Symposium, 1998, New York, Aug. 9, 1998, pp. 442-447.

K. Nishikawa et al., "Multirate Repeating Method For Alias Free Subband Adaptive Filters", IEICE Transactions on fundamentals of Electronics, Communications and Computer Sciences, Institute of Electronics Information and Comm., Eng., Tokyo, Japan, vol. E85-A, No. 4, Apr. 2002, pp. 776-783.

"Multirate Repeating Method for Alias Free Subband Adaptive Filters", Nishikawa, et al., IEICE Fundamentals, vol. E85-A, No. 4 Apr. 2002, p. 776-783.

"Adaptive Filtering in Subbands with Critical Sampling: Analysis, Experiments, and Application to Acoustic Echo Cancellation", Gilloire, et al., IEEE Transactions on Signal Processing, vol. 40, No. 8, Aug. 1992, p. 1862-1875.

"Parallel DAF Measurement Device (PDMD) for Non-Instrusive Whitening of Speech", Wai Pang Ng, et al., p. 1052-1056.

"On the Use of A Modified Fast Affine Projection Algorithm in Subbands for Acoustic Echo Cancelation", Q. G. Liu, et al., INRS-Telecommunications, Proc. 1996 IEEE Digital Signal Processing Workshop, pp. 354-357.

"Double-Talk Robust Fast Converging Algorithms For Network Echo Cancellation", Tomas Gansler, et al., Proc. 1999 IEEE Workshop on Applications of Signal Processing to Audio and Acoustics, New Paltz, New York, Oct. 17-20, 1999, pp. 215-218.

"Performance Comparisons of Two Adaptive Subband Structures", Mariane R. Petraglia, et al., 1996 IEEE, pp. 235-238.

"An Adaptive Filtering Algorithm Using an Orthogonal Projection to an Affine Subspace and its Properties", Kazuhiko Ozeki, et al., Electronics and Communications in Japan, vol. 67-A, No. 5, 1984, pp. 19-27.

"RLS Algorithm for a New Subband Adaptive Structure with Critical Sampling", R.G. Alves, et al., 1998 IEEE, pp. 442-447.

"Sub-band Adaptive Signal Processing in an Oversampled Filterbank", pp. 1-15.

"Highly Oversampled Subband Adaptive Filters for Noise Cancellation on a Low-Resource DSP System", King Tam, et al., pp. 1-4.

"A Set of Algorithms Linking NLMS and Block RLS Algorithms", Mohsen Montazeri, et al., IEEE Transactions on Signal Processing, vol. 43, No. 2, Feb. 1995, pp. 444-453.

"Robust Fast Affine Projection Algorithm for Acoustic Echo Cancellation", Ville Myllyla, Darmstadt University of Technology, Institute of Communication Technology, pp. 1-4.

"Polyphase Analysis of Subband Adaptive Filters", Stephan Weiss, et al., pp. 1-5.

"On Adaptive Filtering in Oversampled Subbands", Stephan Weib, 1998, pp. 1-213.

"Frequency-Domain and Multirate Adaptive Filtering", John J. Shynk, IEEE SP Magazine, Jan. 1992, pp. 14-37.

"Slow Asymptotic Convergence of LMS Acoustic Echo Cancelers", Dennis R. Morgan, IEEE Transactions on Speech and Audio Processing, vol. 3, No. 2, Mar. 1995, pp. 126-136.

ISCAS '98, Proceedings of the IEEE 1998 International Symposium on Circuits and Systems, IEEE Catalog No. 98CH36187, "A Flexible Filterbank Structure For Extensive Signal Manipulations in Digital Hearing Aids", Robert Brennan, pp. VI-569-VI-572.

"Adaptive Noise Cancelling: Principles and Applications", Bernard Widrow, et al., Proceedings of the IEEE, vol. 63, No. 12, Dec. 1975, pp. 1692-1716.

"A Flexible Filterbank Structure for Extensive Signal Manipulations in Digital Hearing Aids", Robert Brennan, et al., 1998 IEEE, pp. VI-569-VI-572.

"Performance Analysis of Adaptive Filter Structures Based on Subband Decomposition", Mariane R. Petraglia, et al., 1993 IEEE, pp. 60-63.

"Multirate Digital Filters, Filter Banks, Polyphase Networks, and Applications: A Tutorial", P.P. Vaidyanathan, 8078 Proceedings of the IEEE 78(Jan. 1990), No. 1, New York, US, pp. 56-93.

\* cited by examiner

METHOD AND SYSTEM FOR PROCESSING SUBBAND SIGNALS USING ADAPTIVE FILTERS

BACKGROUND OF THE INVENTION

1. Field of the Invention

The present invention relates to signal processing, more specifically to a method and system for processing subband signals using adaptive filters.

2. Background

It is well known that a noise cancellation system can be implemented with a fullband adaptive filter working on the entire frequency band of interest. The Least Mean-Square (LMS) algorithm and its variants are often used to adapt the fullband filter with relatively low computation complexity and adequate performance when the interfering signal is white. However, the fullband LMS solution suffers from significantly degraded performance with colored interfering signals due to large eigenvalue spread and slow convergence. Moreover, as the length of the LMS filter is increased, the convergence rate of the LMS algorithm decreases and computational requirements increase. This is problematic in applications, such as acoustic echo cancellation, which demand long adaptive filters to model the return path response and delay. These issues are especially important in portable applications, where processing power must be conserved.

As a result, subband adaptive filters (SAFs) become an interesting and viable option for many adaptive systems. The SAF approach uses a filterbank to split the fullband signal input into a number of frequency bands, each serving as input to an adaptive filter. This subband decomposition greatly reduces the update rate and the length of the adaptive filters resulting in much lower computational complexity.

Subband signals are often maximally decimated in SAF systems by critical sampling. This leads to a whitening of the input signals and an improved convergence behavior. For example, there is an SAF system with critical sampling (A. Gilloire and M. Vetterli, "Adaptive Filtering in Subbands with Critical Sampling: Analysis, Experiments and Applications to Acoustic Echo Cancellation". *IEEE Trans. Signal Processing*, vol. SP-40, no. 8, pp. 1862-1875, August 1992).

However, the maximal decimation/critical sampling creates aliasing problems. The presence of aliasing distortion requires the use of adaptive cross-filters between adjacent subbands or gap filterbanks. Systems with cross-filters generally converge slower and have higher computational cost, while gap filterbanks produce significant signal distortion.

It is therefore desirable to provide a method and system for processing subband signals using adaptive filters, facilitating high speed processing, low power consumption and high quality.

SUMMARY OF THE INVENTION

It is an object of the present invention to provide a method and system which obviates or mitigates at least one of the disadvantages described above.

In accordance with an aspect of the present invention, there is provided a method of processing subband signals for cancelling an undesired effect on a signal, the method comprising steps of: analysing a primary signal, which has a signal affected by an undesired signal, and a reference signal corresponding, to the undesired signal to produce frequency domain primary signals and frequency domain reference signals in a plurality of subbands; processing the frequency domain primary signal and the frequency domain reference signal using an adaptive filter in each subband, comprising operating on at least the frequency domain reference signal to improve the convergence of the adaptive filter in each subband; and synthesizing the outputs of the adaptive processing blocks to output a time domain signal in which the effect of the reference has been cancelled.

In accordance with a further aspect of the present invention, there is provided a system for processing subband signals for cancelling an undesired effect on a signal. The system includes: an analysis filterbank for analysing a primary signal, which has a signal affected by an undesired signal, and a reference signal corresponding, to the undesired signal to produce frequency domain primary signals and frequency domain reference signals in a plurality of subbands; a processing module for processing the frequency domain primary signals and the frequency domain reference signals, including an adaptive filter module in each subband, and a module for operating on at least the frequency domain reference signal to improve the convergence of each adaptive filter; and a synthesis filterbank for synthesizing the outputs of the processing module to output a time domain signal in which the effect of the reference has been cancelled.

A further understanding of other features, aspects and advantages of the present invention will be realized by reference to the following description, appended claims, and accompanying drawings.

BRIEF DESCRIPTION OF THE DRAWINGS

The invention will be further understood from the following description with reference to the drawings in which.

DETAILED DESCRIPTION OF THE PREFERRED EMBODIMENT(S)

Figure 1:
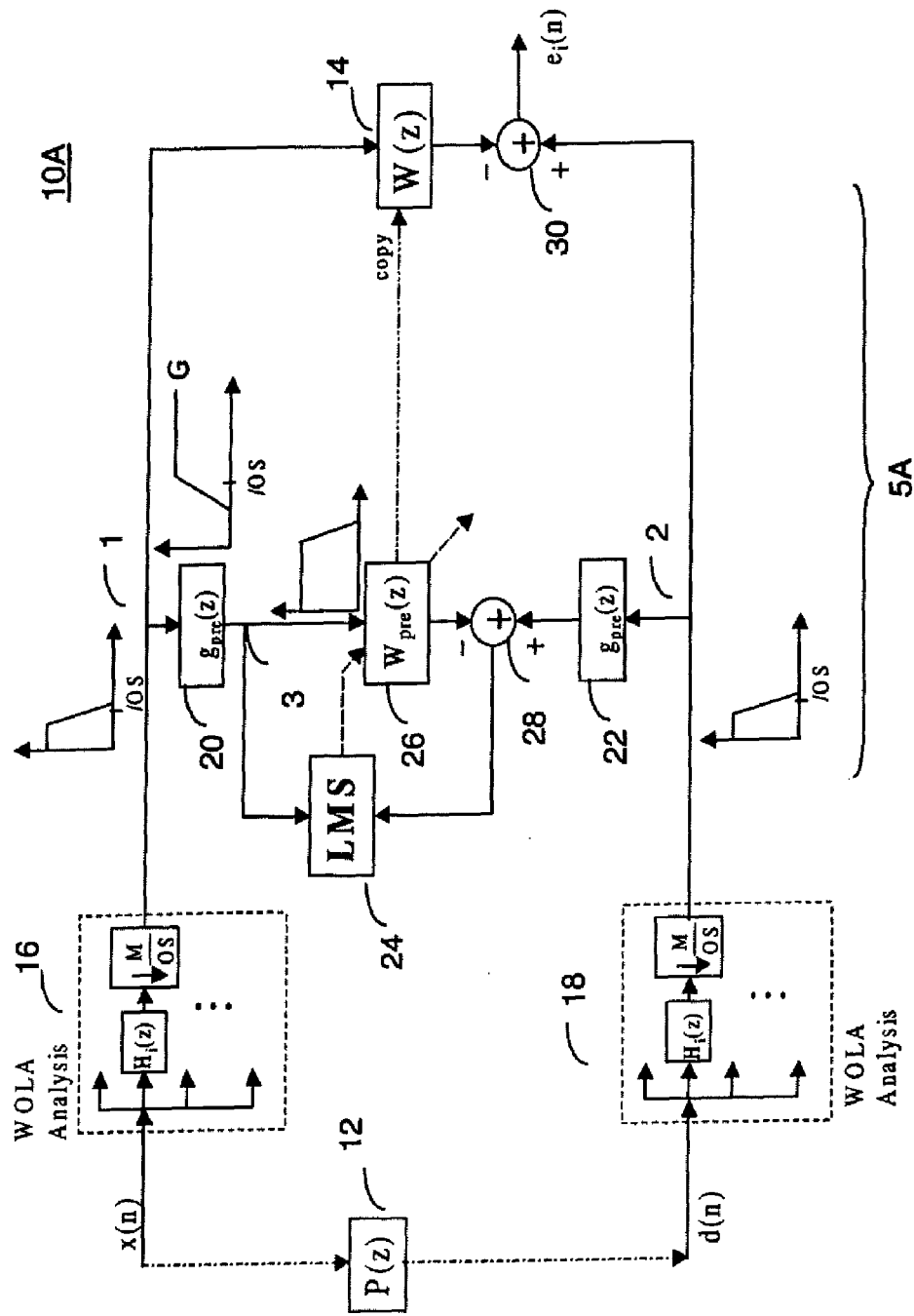
FIG. 1 is a block diagram showing a subband adaptive filter (SAF) system in accordance with a first embodiment of the invention.
Figure 2:
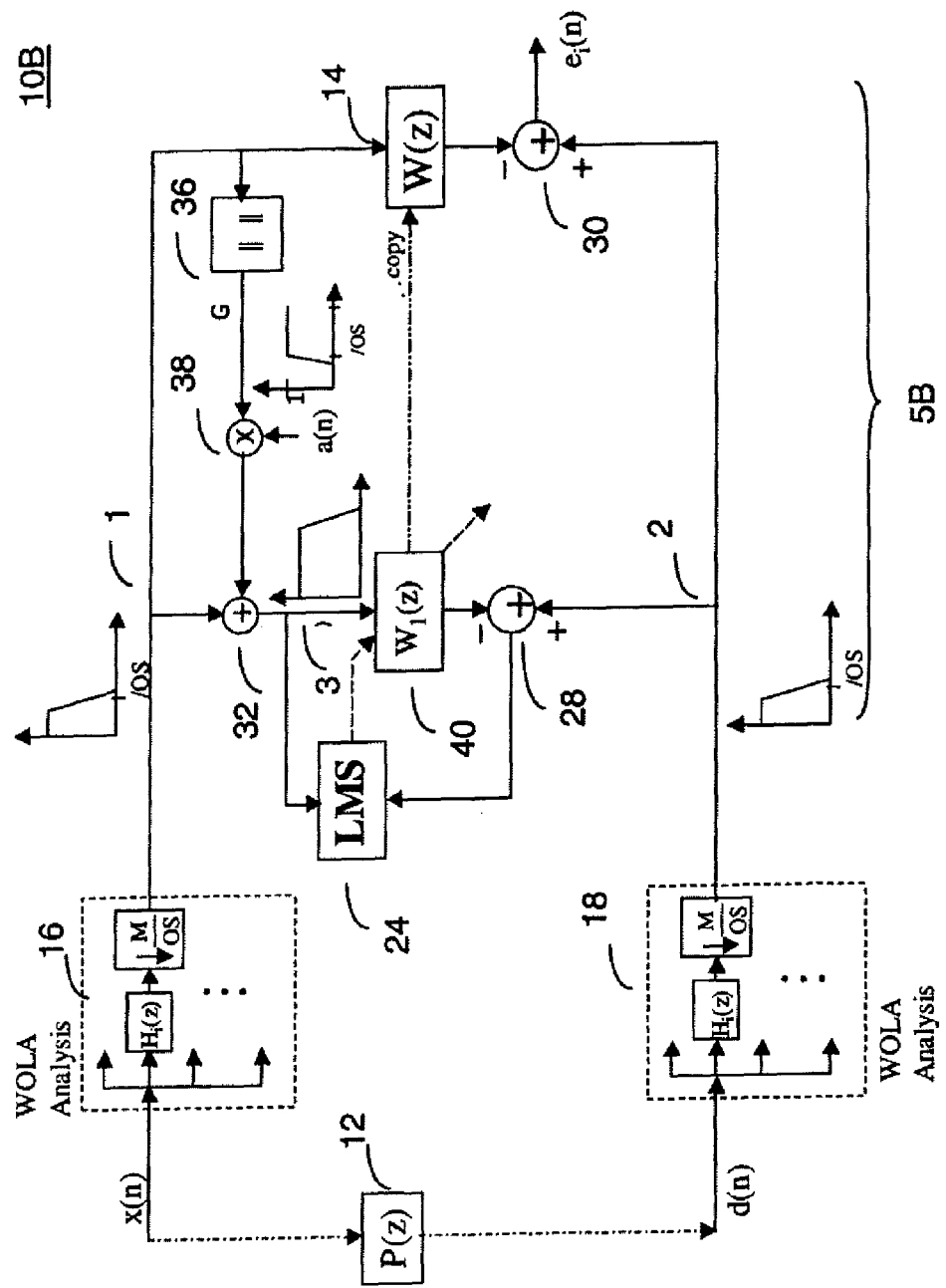
FIG. 2 is a block diagram showing an SAF system in accordance with a second embodiment of the invention.
Figure 3:
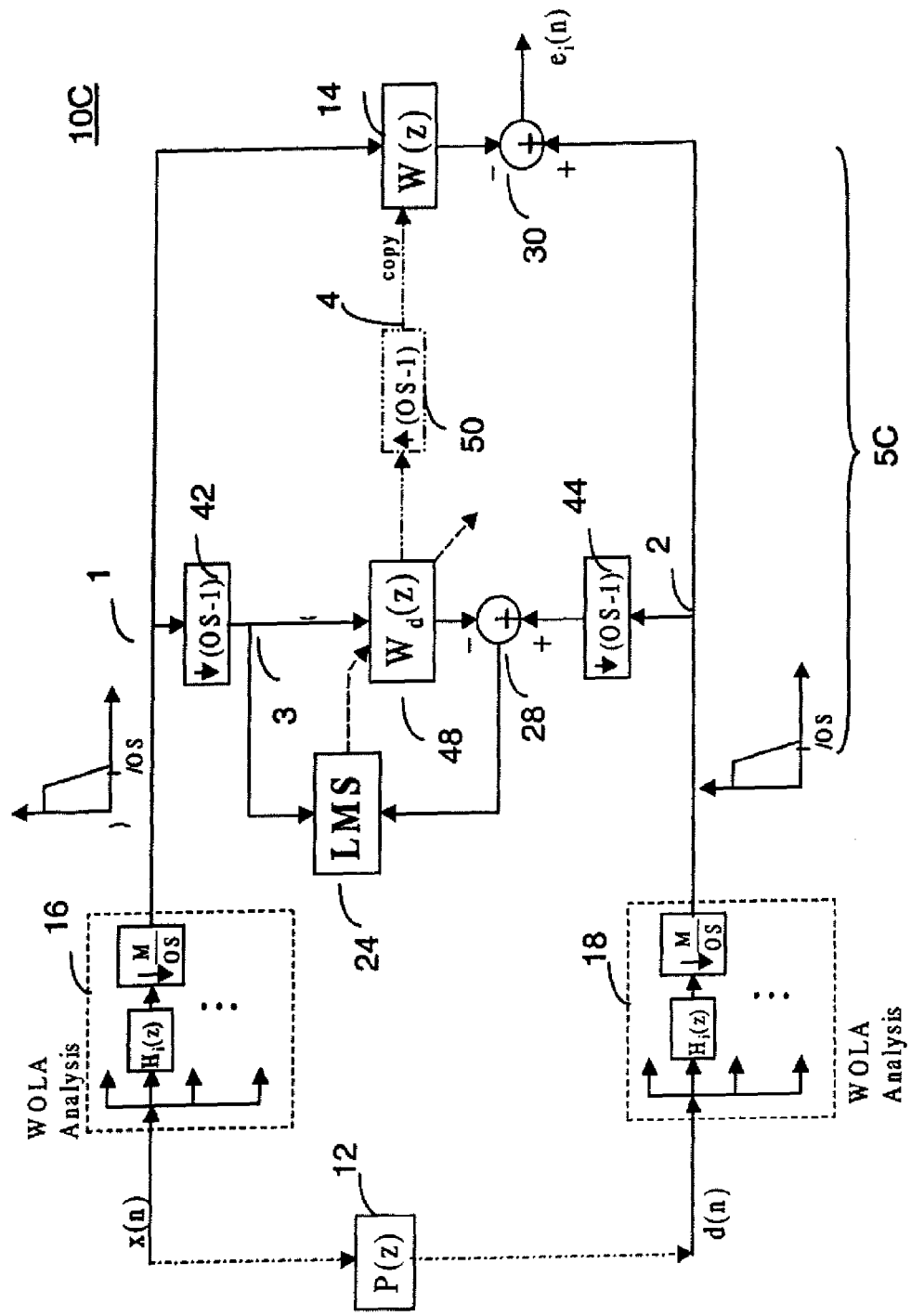
FIG. 3 is a block diagram showing an SAF system in accordance with a third embodiment of the invention.

Subband adaptive filter (SAF) systems in accordance with embodiments of the present invention are illustrated in FIGS. 1-3. The SAF systems 10A-10C of FIGS. 1-3 have the functionality of improving the convergence properties of adaptive filters. The SAF system is implemented using an oversampled weighted overlap-added (WOLA) filterbank. The oversampled WOLA filterbanks are described in U.S. Pat. No. 6,236,731, U.S. Pat. No. 6,240,192, and R. Brennan and T. Schneider, "A Flexible Filterbank Structure for Extensive Signal Manipulations in Digital Hearing Aids", *Proc. IEEE Int. Symp. Circuits and Systems*, pp. 569-572, 1998, which are incorporated by reference. The oversampled WOLA filterbank may be implemented using a digital signal processor (DSP) technology.

The oversampled WOLA filterbank has a WOLA analysis filterbank for transforming input signals into oversampled subband signals, subband signal processors for processing oversampled subband signals using adaptive filters and a WOLA synthesis filterbank for combining the subband signals. The spectra of the oversampled subband signals are not white. When oversampling factors of 2 and 4 are employed for example, their spectral bandwidth is limited to $\pi/2$ and $\pi/4$ respectively. A critically sampled system by comparison produces subband signals in the complete range from dc to $\pi$. In the SAF systems 10A-10C described below, the oversampled subband signals are whitened to increase the convergence rate of the adaptive filters. The inherent benefit of decreased spectral dynamics resulting from subband decomposition is, therefore, not lost due to oversampling.

The SAF system 10A of FIG. 1 is now described in detail. The SAF system 10A has the functionality of whitening oversampled subband signals in their spectra by spectral emphasis, which increases the convergence rate of the Least Mean-Square (LMS) algorithm. In SAF system 10A, an unknown plant P(z) 12 is modeled by an adaptive filter W(z) 14.

The SAF system 10A includes WOLA analysis filterbanks 16 and 18 and a plurality of subband processing blocks. In FIG. 1, a subband processing block 5A for subband i is illustrated. This block includes emphasis filters $g_{pre}(z)$ 20 and 22, an LMS block 24, a secondary adaptive filter $W_{pre}(z)$ 26, and an adder 28. The subband processing block 5A may be employed for each subband.

The WOLA analysis filterbank 16 receives a reference signal x(n). The WOLA analysis filterbank 18 receives a primary signal d(n) via the plant P(z) 12. The WOLA analysis filterbanks 16 and 18 convert their input signals into a plurality of oversampled subband signals.

During WOLA analysis, the subband signals are decimated by a factor of M/OS, where M is the number of filters, and OS is the oversampling factor. At this stage, the subband signals are no longer full-band. At the output of the WOLA analysis filterbanks 16 and 18, i.e., points 1 and 2 of FIG. 1, their bandwidth is $\pi/OS$. Thus the spectra are colored but in a predictable, constant manner. The emphasis filters $g_{pre}(z)$ 20 and 22 then amplify the high frequency contents of the signals at the points 1 and 2, respectively, to obtain almost white spectra. The input to the secondary adaptive filter $W_{pre}(z)$ 26, i.e., a signal at point 3, is whitened by the output of the emphasis filter $g_{pre}(z)$ 20.

The adder 28 adds the output of the emphasis filter $g_{pre}(z)$ 22 and the output of the secondary adaptive filter $W_{pre}(z)$ 26. The LMS block 24 receives the output of the emphasis filter $g_{pre}(z)$ 20 and the output of an adder 28, and adjusts the filter coefficients of the secondary adaptive filter $W_{pre}(z)$ 26. The LMS block 24 may implement any of the common variants of the LMS algorithm. Typically the leaky normalized LMS algorithm is used for its stability and low computational cost. In each subband, the coefficients of the adaptive filter $W_{pre}(z)$ 26 are copied to the adaptive filter W(z) 14. In each subband, the adaptive filter W(z) takes, as its input, the non-emphasized version of the subband signal at the point 1.

The SAF system 10A further includes an adder 30 which receives the output from the adaptive filter W(z) 14 and the signal at the point 2, and outputs a subband signal $e_i(n)$.

The signals $e_i(n)$ (i=0, 1, ..., K−1) are combined in a synthesis filterbank (not shown) of the oversampled WOLA filterbank. In this case, the synthesis filterbank processes signals that are not affected by the emphasis filters $g_{pre}(z)$ 22 and 24.

The design of the emphasis filters $g_{pre}(z)$ 22 and 24 is dependent on the oversampling factor OS used in the WOLA filterbank. The filter gain (G) of the emphasis filters $g_{pre}(z)$ 20 and 22 is a design parameter that depends on the WOLA analysis filter shape. Given the oversampled WOLA filterbank parameters, the spectral properties of the subband signals are determined, and an appropriate emphasis filter is designed. The filters may be implemented as a Finite Impulse Response (FIR) filter, an Infinite Impulse Response (IIR) filter, or any other filter type.

In the case of two times oversampling, the bottom half of the subband spectrum has relatively high energy and is relatively flat compared to the upper half of the spectrum, which contains very little energy. In this case, the emphasis filter $g_{pre}(z)$ amplifies the high-frequency portion of the spectrum. The filtering operation, thus, results in a signal spectrum that is whitened.

Alternatively, high-pass noise may be added to the bandpass signals to whiten them as described in FIG. 2. The SAF system 10B of FIG. 2 is now described in detail. The SAF system 10B includes the functionality of whitening by additive noise.

The reference signal x(n) and the primary signal d(n) are processed at the WOLA analysis filterbanks 16 and 18 as described above. The SAF system 10B includes a subband processing block. In FIG. 2, the subband processing block 5B for subband i is illustrated. The subband processing block 5B includes adders 28 and 32, an estimation block 36 for estimating the average power G of the signal at the point 1, a mixing block 38 for mixing the average power G and a signal a(n) from a high-pass noise source, the LMS block 24 and a secondary adaptive filter $W_1(z)$ 40. The average power G of the signal at the point 1 is used to modulate the high-pass noise a(n). The adder 32 adds the signal at the point 1 and the output G·a(n) of the mixing block 38. The input to the secondary adaptive filter $W_1(z)$ 40, i.e., a signal at the point 3, is whitened by adding G.a(n) to the signal at point 1. The adder 28 adds the signal at the point 2 and the output of the secondary adaptive filter $W_1(z)$ 40. The LMS block 24 receives the outputs of the adders 32 and 34, and adjusts the filter coefficients of the secondary adaptive filter $W_1(z)$ 40. The coefficients of the secondary adaptive filter $W_1(z)$ 40 are copied to the adaptive filter W(z) 14. The adaptive filter W(z) 14 processes the signal at the point 1, which is not processed by additive noise. The adder 30 receives the output from the adaptive filter W(z) 14 and the signal at the point 2, and outputs a subband signal $e_i(n)$.

The SAF system 10C of FIG. 3 is now described in detail. The SAF system 10C includes the functionality of whitening by decimation.

The reference signal x(n) and the primary signal d(n) are processed at the WOLA analysis filterbanks 16 and 18 as described above. The SAF system 10C includes a subband processing block. In FIG. 3, the subband processing block 5C for subband i is illustrated. The subband processing block 5C includes decimation blocks 42 and 44, the LMS block 24, the adder 28, and a secondary adaptive filter $W_d(z)$ 48. The subband signals at the points 1 and 2 derived from the reference input x(n) and the primary input d(n) are further decimated by a factor of DEC<=OS at the blocks 42 and 44, respectively. Best performance is usually obtained by setting DEC to be less than OS. Assume, without loss of generality, that DEC is set to: DEC=OS−1. The input to the secondary adaptive filter $W_d(z)$ 48, i.e., a signal at the point 3, is whitened by decimating the signal at the point 1. The adder 28 adds the output of the block 44 and the output of the secondary adaptive filter $W_d(z)$ 48. The LMS block 24 receives the outputs of the blocks 42 and 44, and adjusts the filter coefficients of the secondary adaptive filter $W_d(z)$ 48. The filter coefficients of the secondary adaptive filter $W_d(z)$ 48 are expanded at a block 50. The expanded filter coefficients at a point 4, i.e. the output of the block 50 are copied to the adaptive filter W(z) 14. The adaptive filter W(z) 14 processes the signal at the point 1, which is not processed at the blocks 42 and 50. The adder 30 receives the output from the adaptive filter W(z) 14 and the signal at the point 2, and outputs a subband signal $e_i(n)$.

Whitening by decimation is most effective for oversampling factor OS's of more than 2, while whitening by spectral emphasis or by adding noise is most effective for oversampling factor OS's of 2 or less.

Figure 4A:
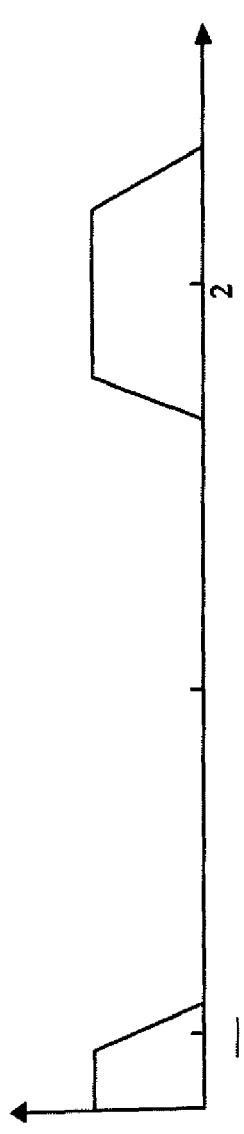
FIGS. 4A-4C are graphs showing signal spectra of FIG. 3.
Figure 4B:
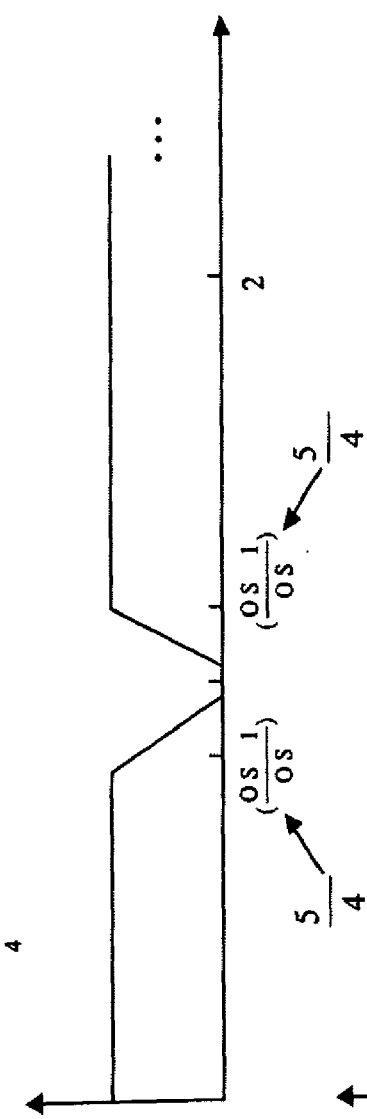
Figure 4C:
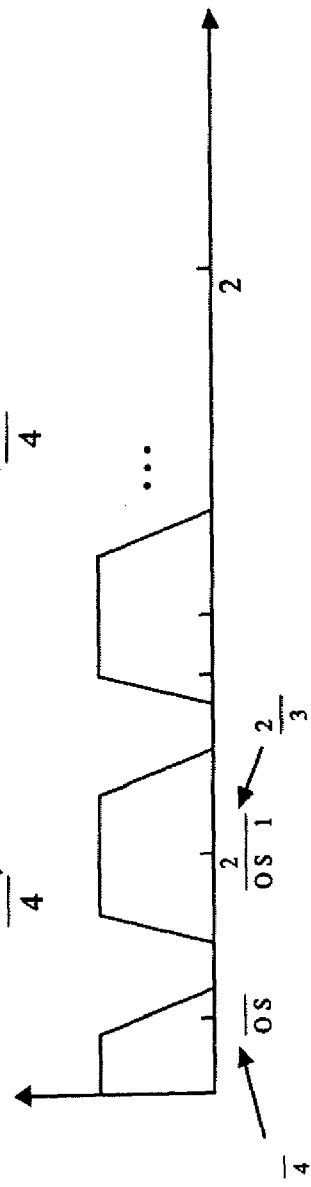

FIG. 4A shows signal spectra at the points 1 and 2 of FIG. 3. FIG. 4B shows signal spectra at the point 3 of FIG. 3. FIG. 4C shows signal spectra at the point 4 of FIG. 3. As illustrated in FIG. 4B, decimating by a factor of DEC increases the bandwidth to π(OS−1)/OS (3π/4 for OS=4) without generating in-band aliasing. Due to the increased bandwidth, the LMS algorithm at the LMS block 24 now converges much faster. To be able to use the adaptive filter W(z) 14, the filter parameter of the secondary adaptive filter $W_d(z)$ is expanded by OS−1. This may create in-band images as shown in FIG. 4C. However, since the low-pass signal at the point 1 does not contain significant energy when ω>π/OS, these spectral images will not contribute to error.

The SAF systems 10A-10C implemented on the oversampled WOLA filterbank (referred to as a oversampled SAF system) are applicable in a wide range of technology areas, including adaptive noise reduction, adaptive directional signal processing with microphone arrays, feedback reduction for hearing aids, and acoustic echo cancellation. The logic contained in the sub-band processing blocks 5A-5C is dependent on a particular application.

One of either the reference signal x(n) or the primary signal d(n) may be a digital signal corresponding to a speaker contaminated with interfering noise, and the other may be a digital signal corresponding to the interfering noise. In this case, the oversampled SAF system cancels noise in the transmitted speech. The subband processing blocks 5A-5C remove the contaminated portion from the desired signal by removing the correlated elements of the two signals by using the LMS algorithm. Since the oversampled subband signals are now whitened in their spectra, the oversampled SAF system performs noise cancellation at high speed enhancing the signal experienced by the listener.

The oversampled SAF system may be used for acoustic echo cancellation or acoustic feedback cancellation. In the case for the echo cancellation, one of either the reference signal x(n) or the primary signal d(n) may be a digital signal that has a desired signal affected by an echo, while the other is a digital signal corresponding to the echo.

The LMS parameters at the LMS block 24, such as LMS step-size, may vary in each subband. For example, when lower subbands contain speech content, the lower subbands may have a smaller step-size, while higher sub-bands may be more adapted with a larger step-size due to relatively low speech content. While the LMS technique is described above, other techniques such as recursive least squares may also be applicable.

Another method of improving the convergence rate is to employ adaptation strategies that are fundamentally less sensitive to eigenvalue spread problem. One of these strategies is the adaptive algorithm called the affine projection algorithm (APA). The APA forms a link between Normalized LMS (NLMS) and the Recursive Least Square (RLS) adaptation algorithms. The benefits of faster convergence of the RLS algorithm (it is expected to be largely insensitive to the eigenvalue spread problem) and the low computational requirements of the NLMS are combined in the APA. An SAF system with affine projection will now be described in detail.

In NLMS, the new adaptive filter weights best fit the last input vector to the corresponding desired signal. In APA, this fitting expands to the P−1 past input vectors (P being the APA order). Adaptation algorithm for the $P^{th}$ order APA can be summarized as follows:

1) update $X_n$ and $d_n$
2) $e_n = d_n X_n^T W_n^*$
3) $W_{n+i} = W_n + \pi X_n (X_n^H X_n + \alpha I)^{-1} e_n^*$ where:
$X_n$: an L×P matrix containing P past input vectors
$d_n$: a vector of the past P past desired signal samples
$W_n$: adaptive filter weights vector at time n
$\alpha$: regularization factor
$\mu$: adaptation step size The convergence of APA is surveyed in K. Ozeki and T. Umeda, "An adaptive algorithm filtering using an orthogonal projection to the affine subspace and its properties," *Electronics and Communications in Japan*, vol. 67-A, no. 5, pp. 19-27, Feb. 1984, and M. Montazeri and P. Duhamel, "A set of algorithms linking NLMS and block RLS algorithms" *IEEE Tran. on Signal Processing*, vol. 43, no. 2, pp. 444-453, Feb. 1995. As the projection order P increases, the convergence rate of APA becomes less dependent on the eigenvalue spread. Increasing the APA order results in faster convergence at the cost of more computational complexity of the adaptation algorithm.

Figure 5:
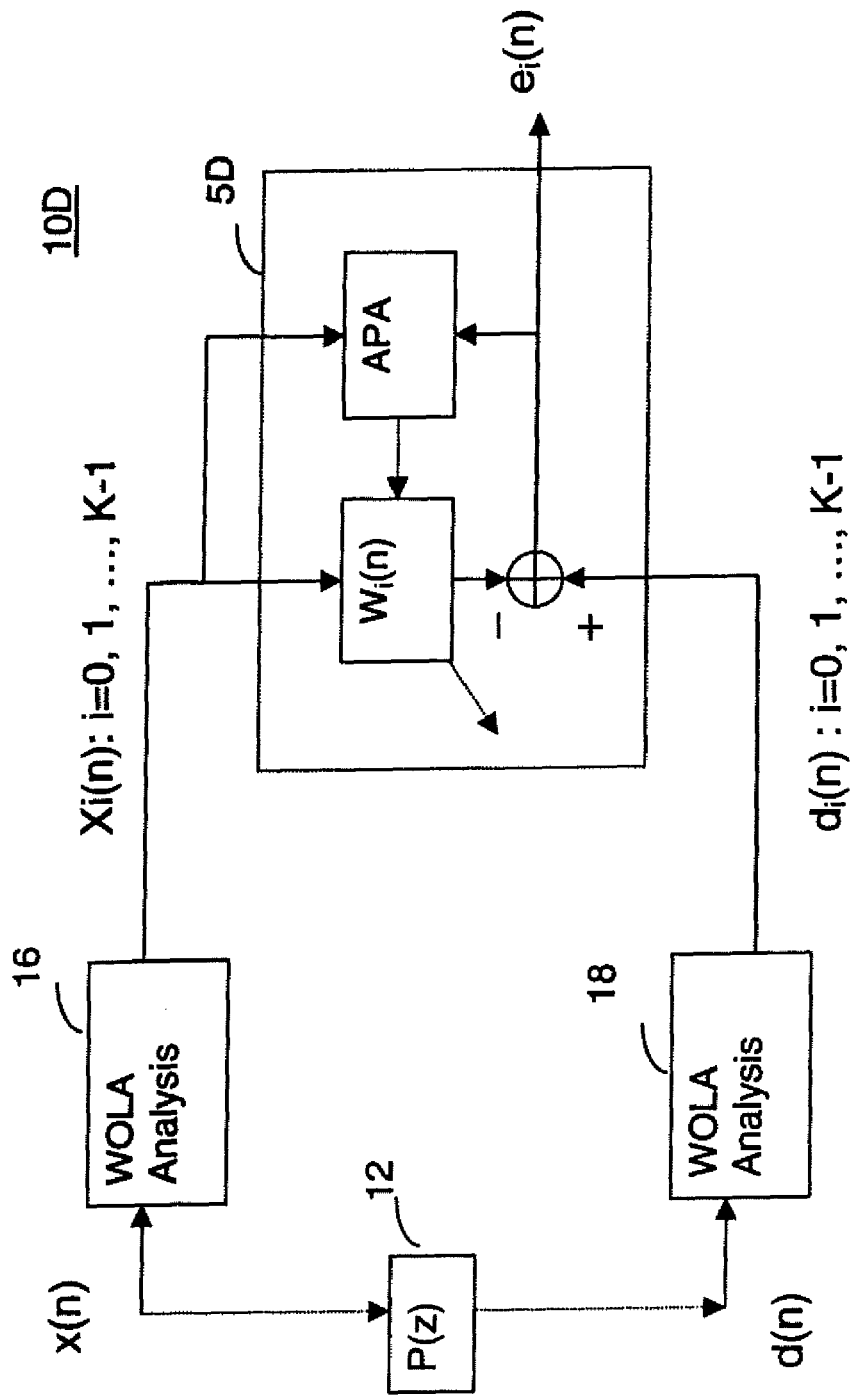
FIG. 5 is a block diagram showing a SAF system in accordance with a fourth embodiment of the invention.

FIG. 5 shows an SAF system 10D in accordance with a fourth embodiment of the present invention. The SAF system 10D includes the WOLA analysis filterbanks 16 and 18, and a plurality of APA subband processing blocks. In FIG. 5, a sub-band processing block 5D for subband i is illustrated. The sub-band processing block 5D contains an adaptive filter using APA to adapt its weights Wi(n) (n: time).

The SAF system 10D may be implemented on an oversampled WOLA filterbank. For computational simplicity, an APA of order P=2 may be applied, producing faster convergence with minimal increase in complexity. In this case, the matrix $X_n^H X_n$ is approximated by R (autocorrelation matrix of the reference signal) as described in V. Myllyla, "Robust fast affine projection algorithm for acoustic echo cancellation," in *proc. of Inter. Workshop on Acoustic Echo and Noise Control*, September 2001.

For P=2, it is sufficient to estimate only the first two autocorrelation coefficients (r(0) and r(1)) and then invert the matrix R, analytically. A first order recursive smoothing filter may be used to estimate r(0) and r(1).

Figure 23:
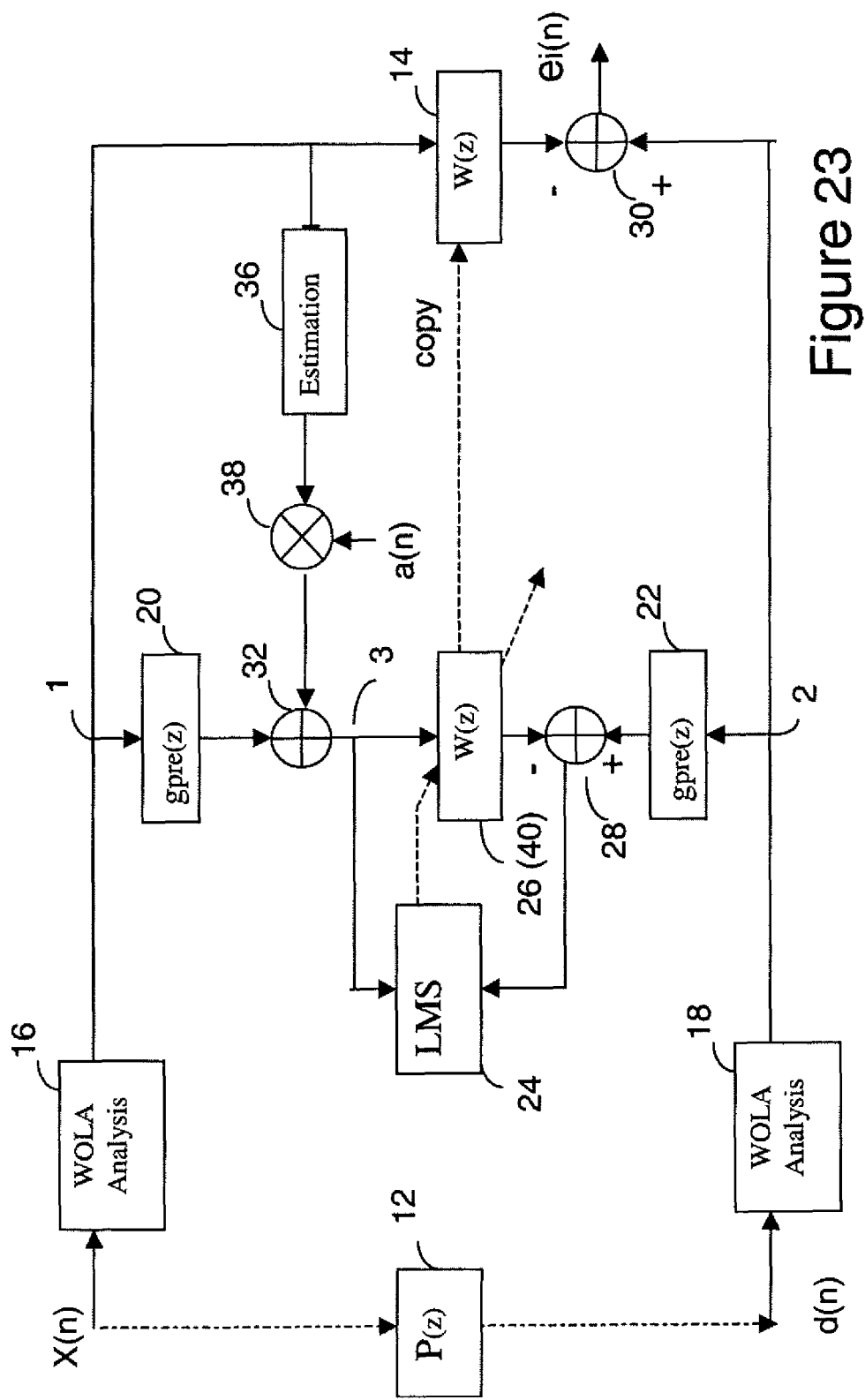
FIG. 23 is a block diagram showing an example of a combination of FIGS. 1 and 2.
Figure 24:
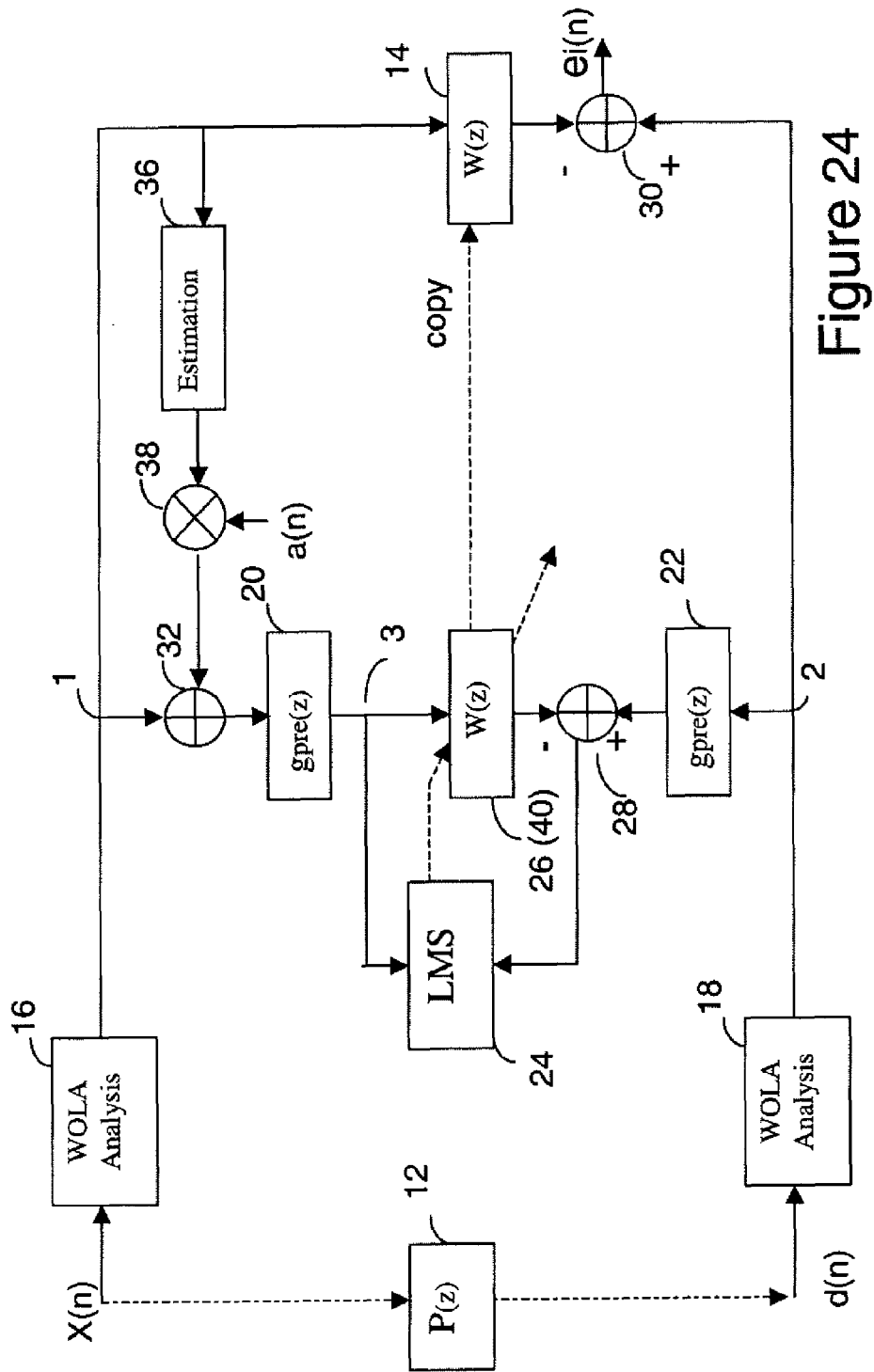
FIG. 24 is a block diagram showing another example of the combination of FIGS. 1 and 2.
Figure 25:
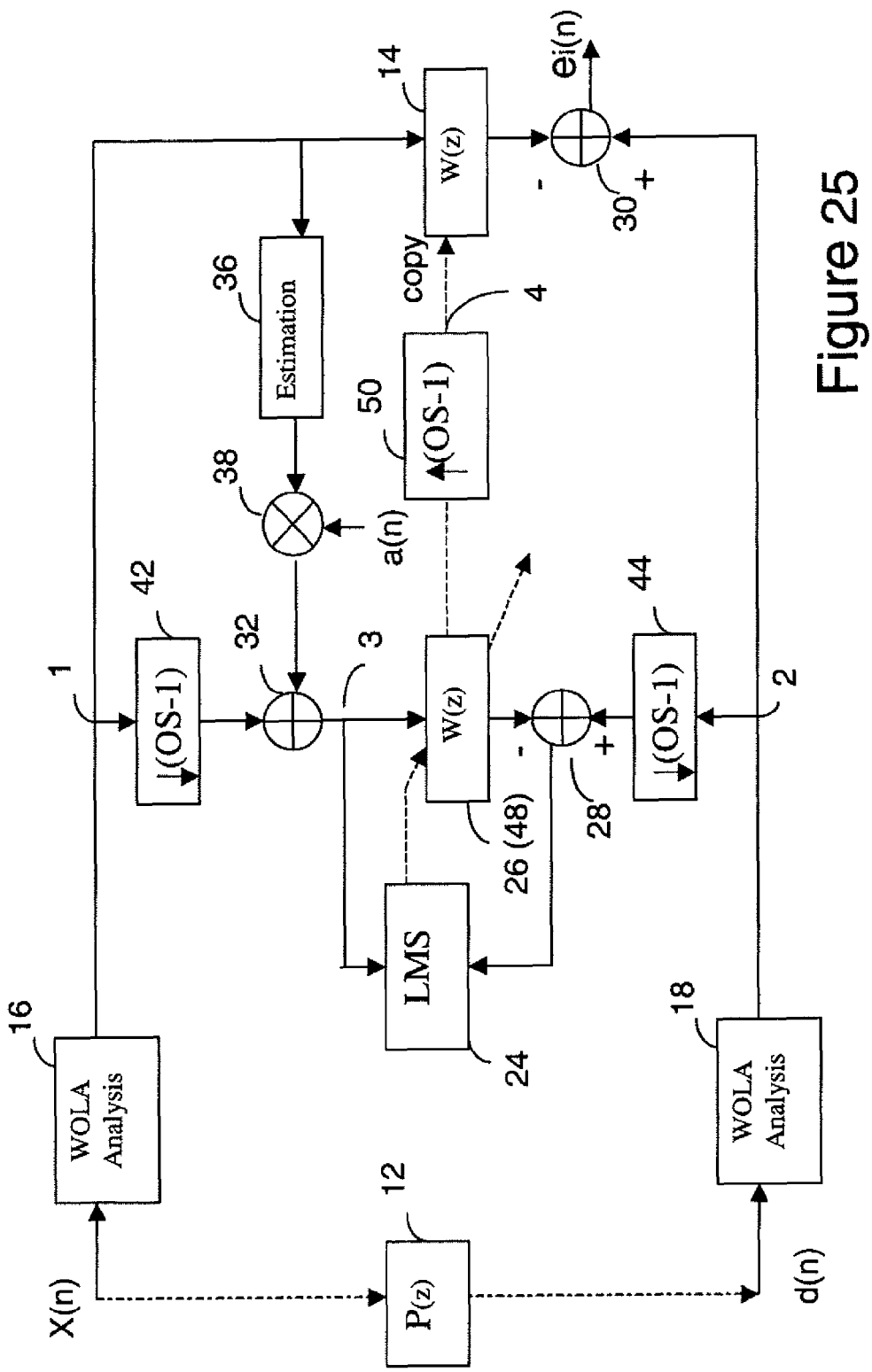
FIG. 25 is a block diagram showing an example of a combination of FIGS. 2 and 3.
Figure 26:
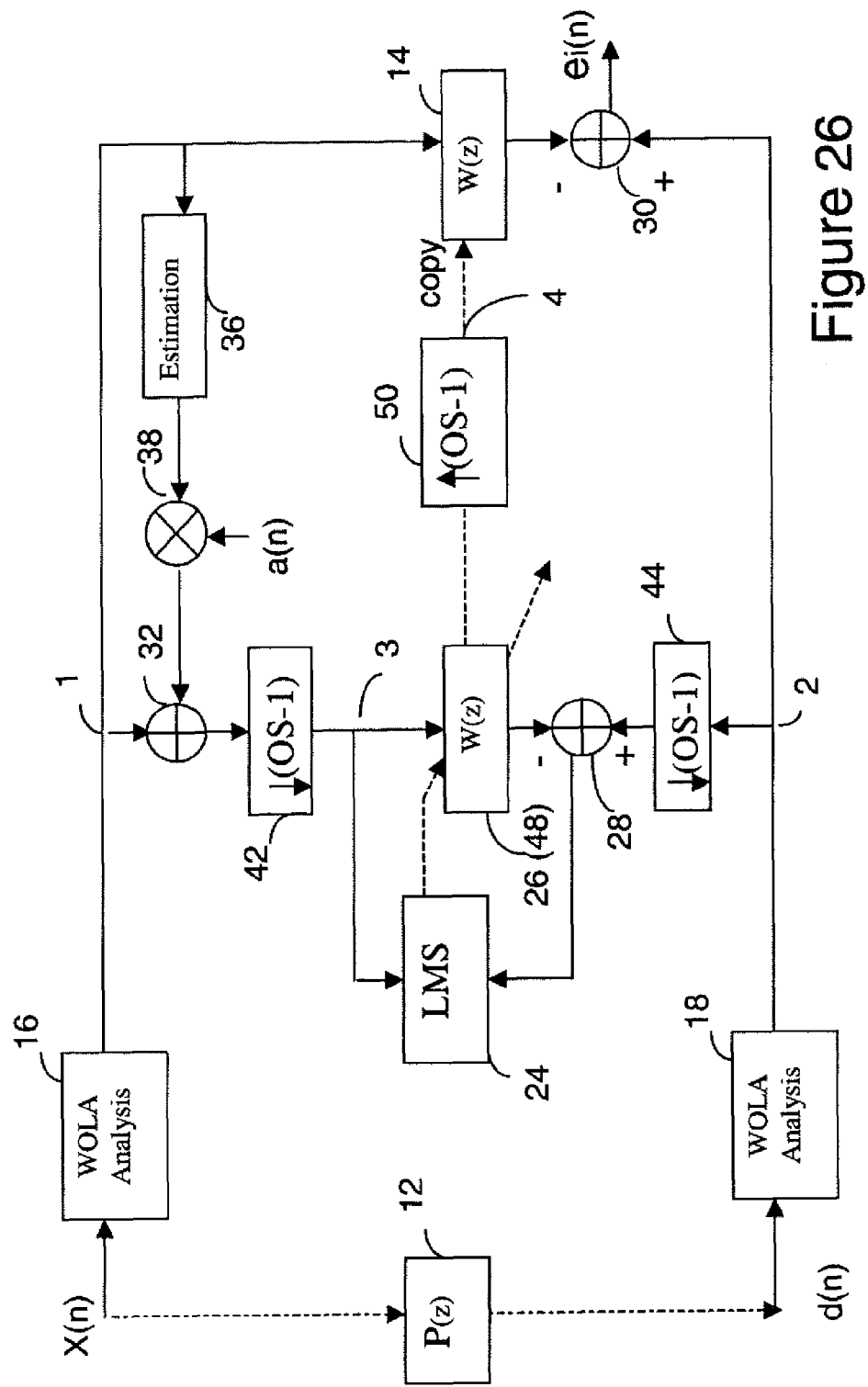
FIG. 26 is a block diagram showing another example of the combination of FIGS. 2 and 3.
Figure 27:
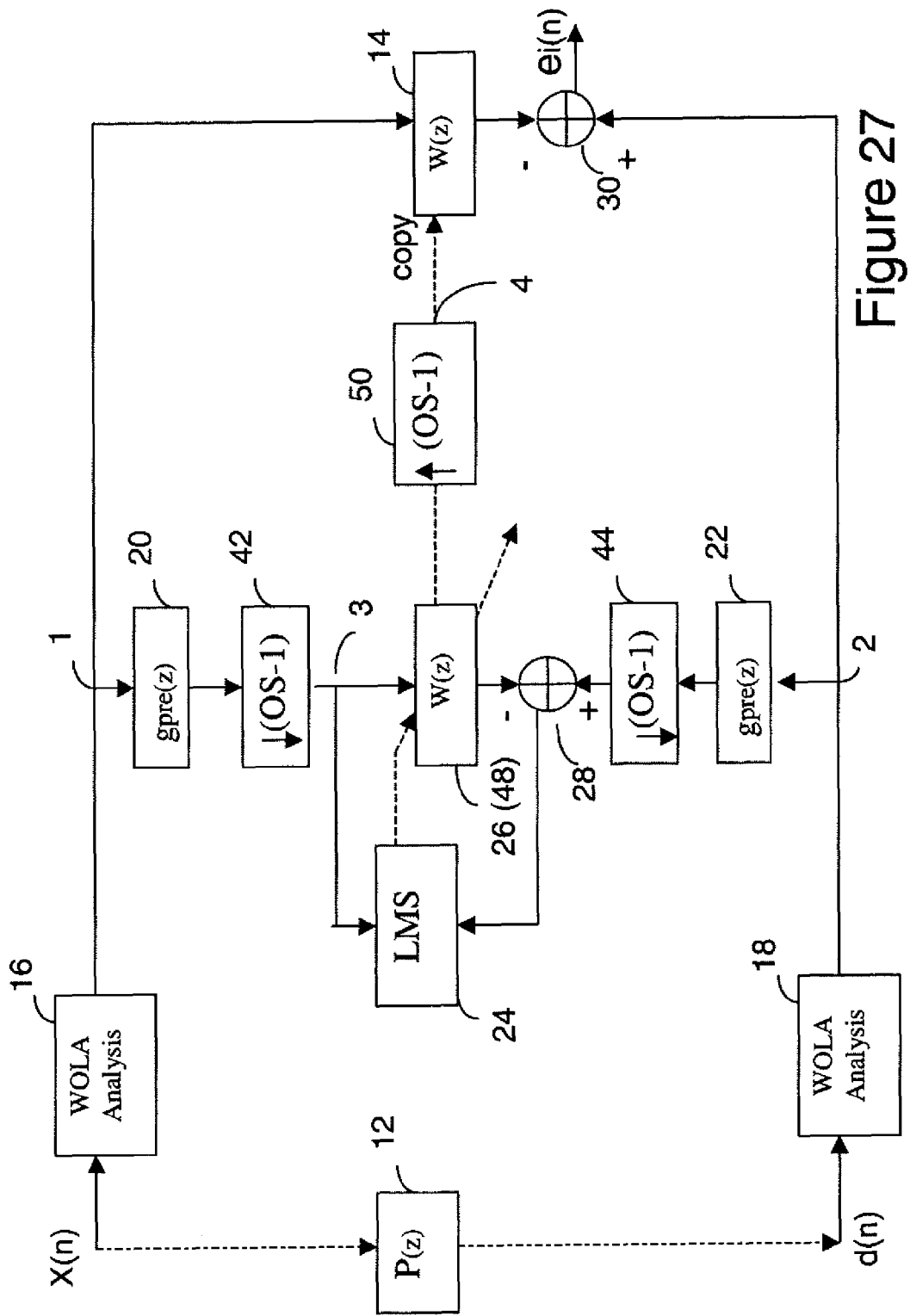
FIG. 27 is a block diagram showing an example of a combination of FIGS. 1 and 3.
Figure 28:
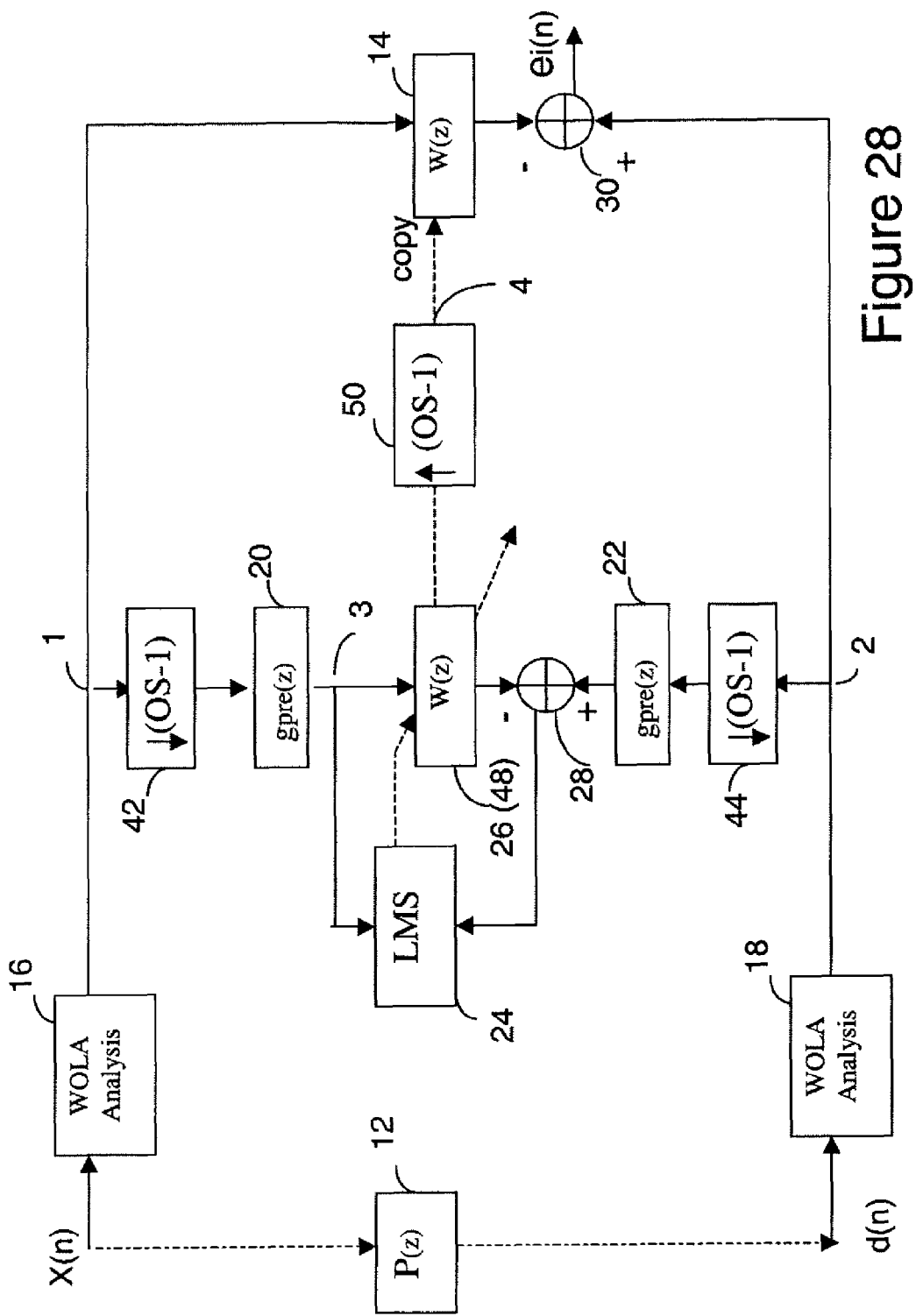
FIG. 28 is a block diagram showing another example of the combination of FIGS. 1 and 3.
Figure 29:
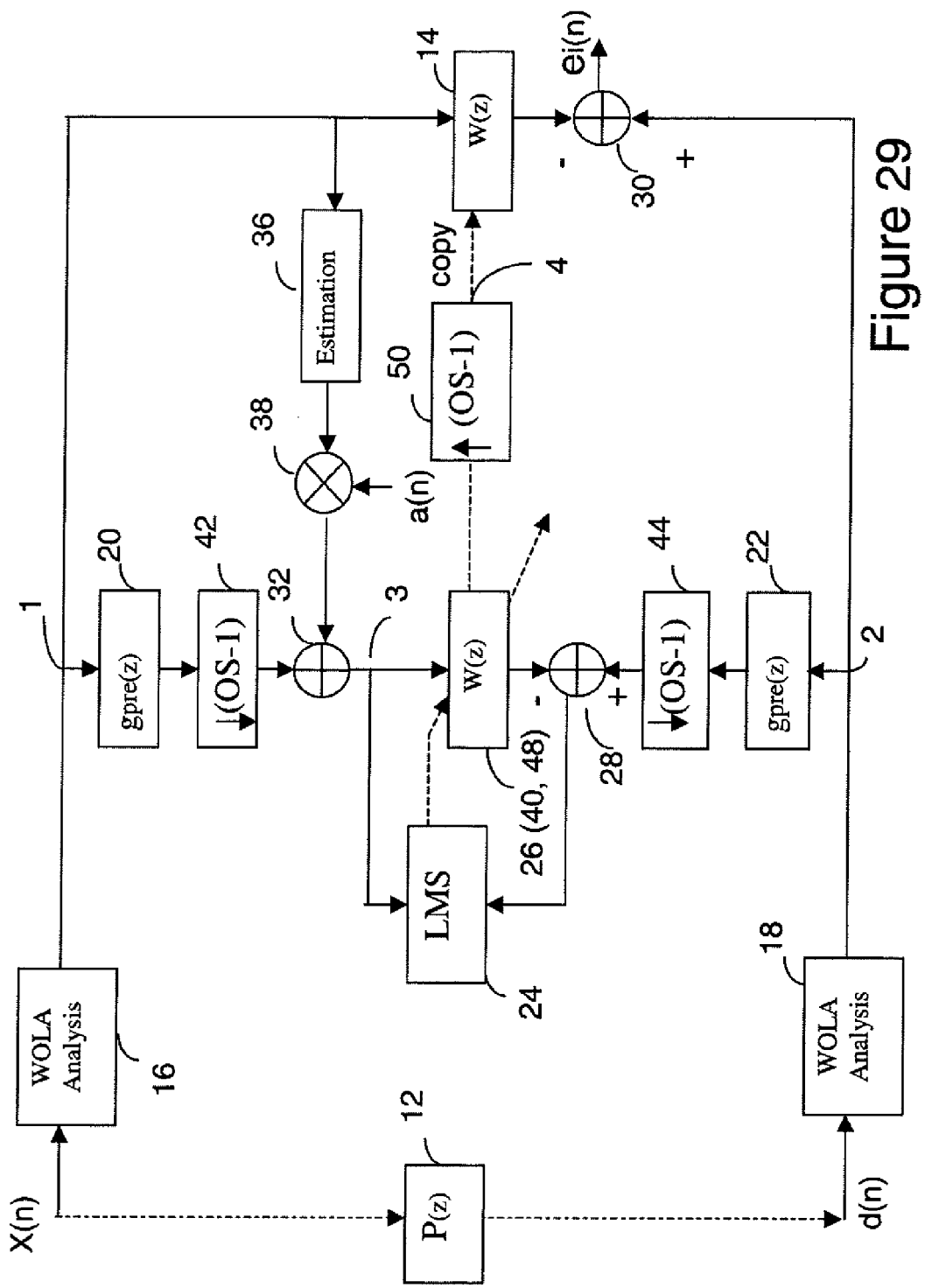
FIG. 29 is a block diagram showing an example of a combination of FIGS. 1-3.
Figure 30:
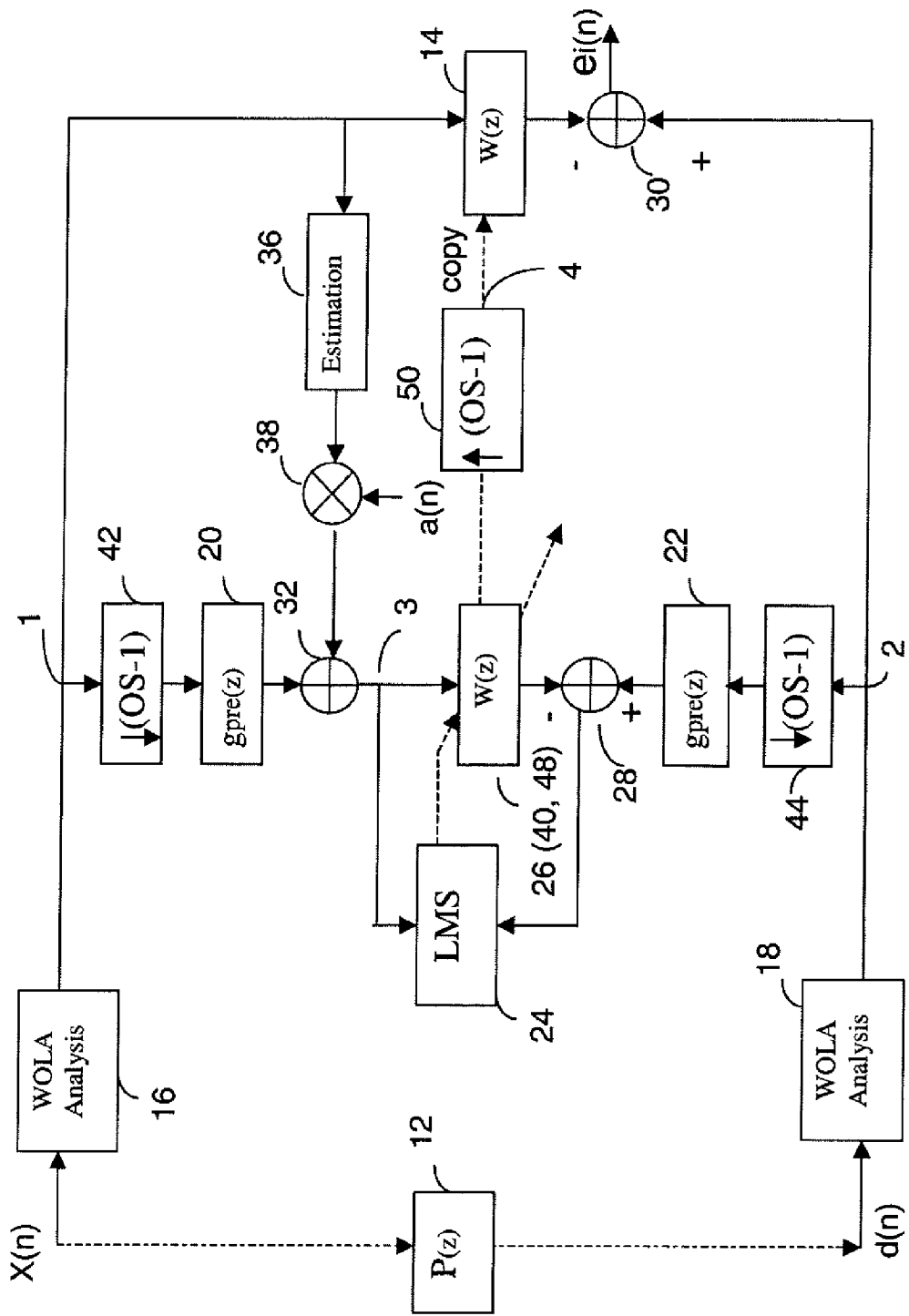
FIG. 30 is a block diagram showing another example of the combination of FIGS. 1-3.
Figure 31:
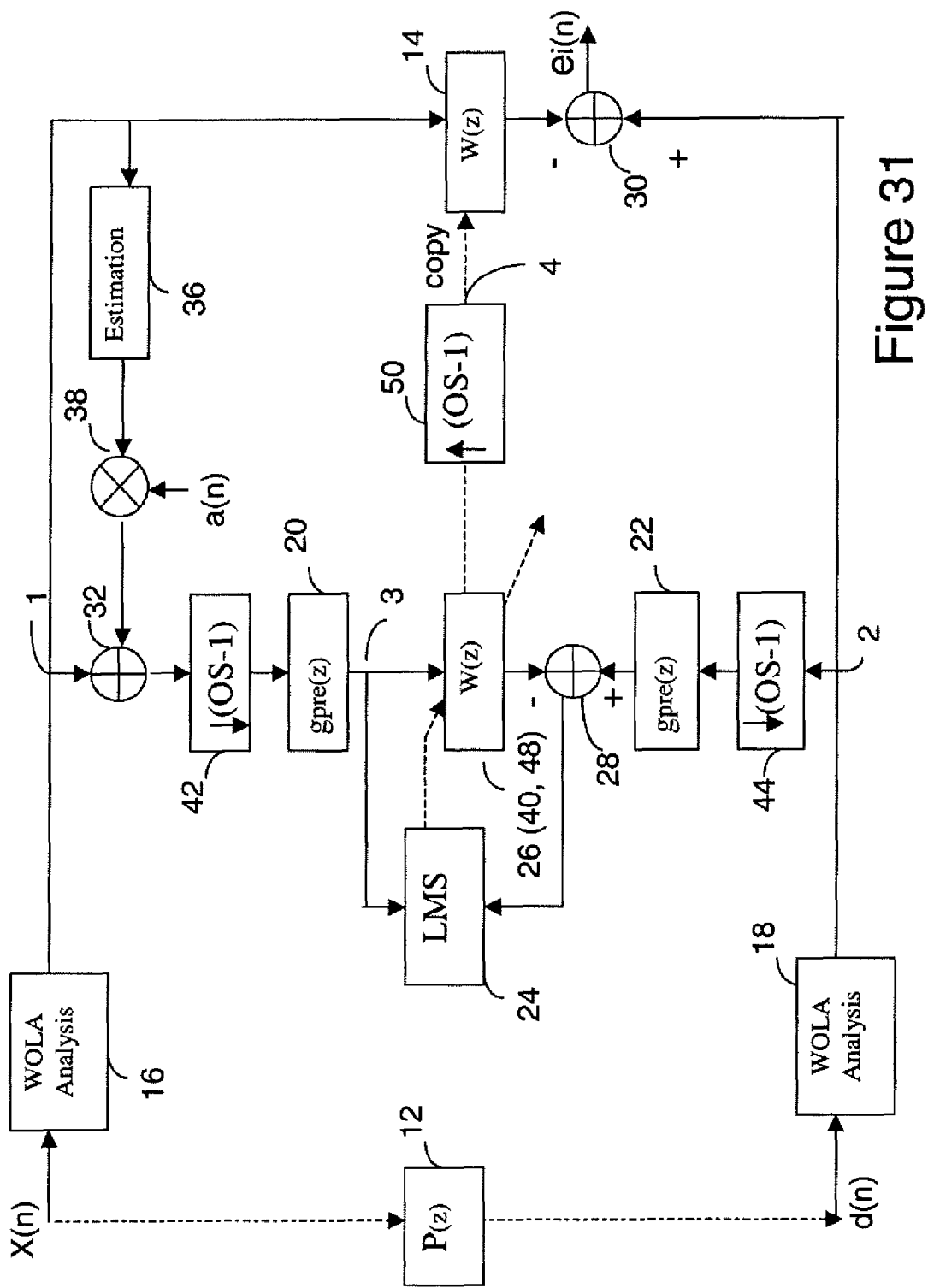
FIG. 31 is a block diagram showing a further example of the combination of FIGS. 1-3.
Figure 32:
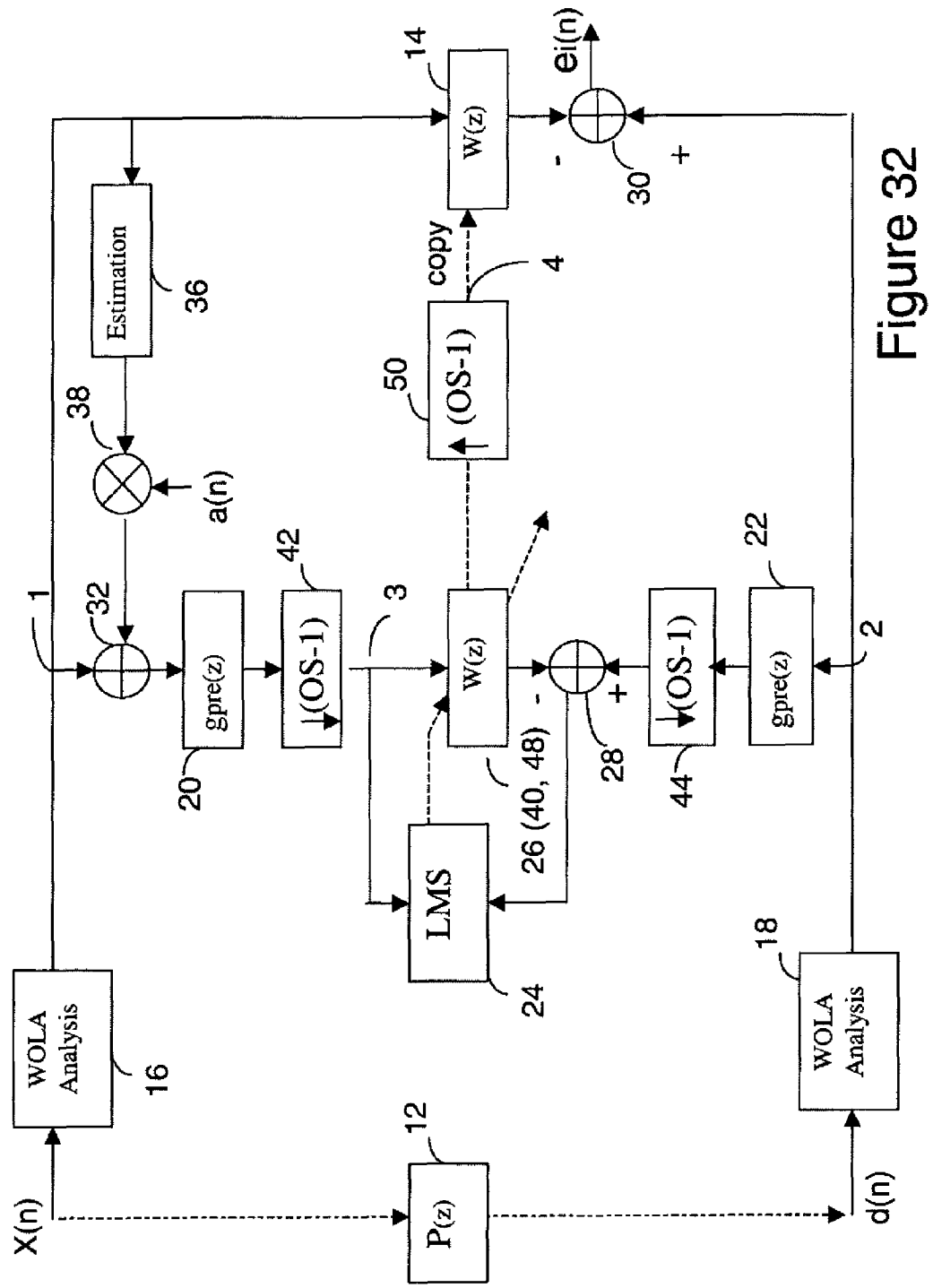
FIG. 32 is a block diagram showing a further example of the combination of FIGS. 1-3.

It is possible to combine any two or more of the techniques described in FIGS. 1-3 and 5 to achieve higher performance. FIGS. 23-24 illustrate examples of the combinations of the techniques illustrated in FIGS. 1 and 2. FIGS. 25-26 illustrate examples of the combinations of the techniques illustrated in FIGS. 2 and 3. FIGS. 27-28 illustrate examples of the combinations of the techniques illustrated in FIGS. 1 and 3. FIGS. 29-32 illustrate examples of the combinations of the techniques illustrated in FIGS. 1, 2 and 3. For example, whitening by decimation improves the convergence rate by increasing the effective bandwidth of the reference signal. Whitening by spectral emphasis improves the convergence as before by limiting the stop band loss thereby increasing the smallest eigenvalues.

Figure 6:
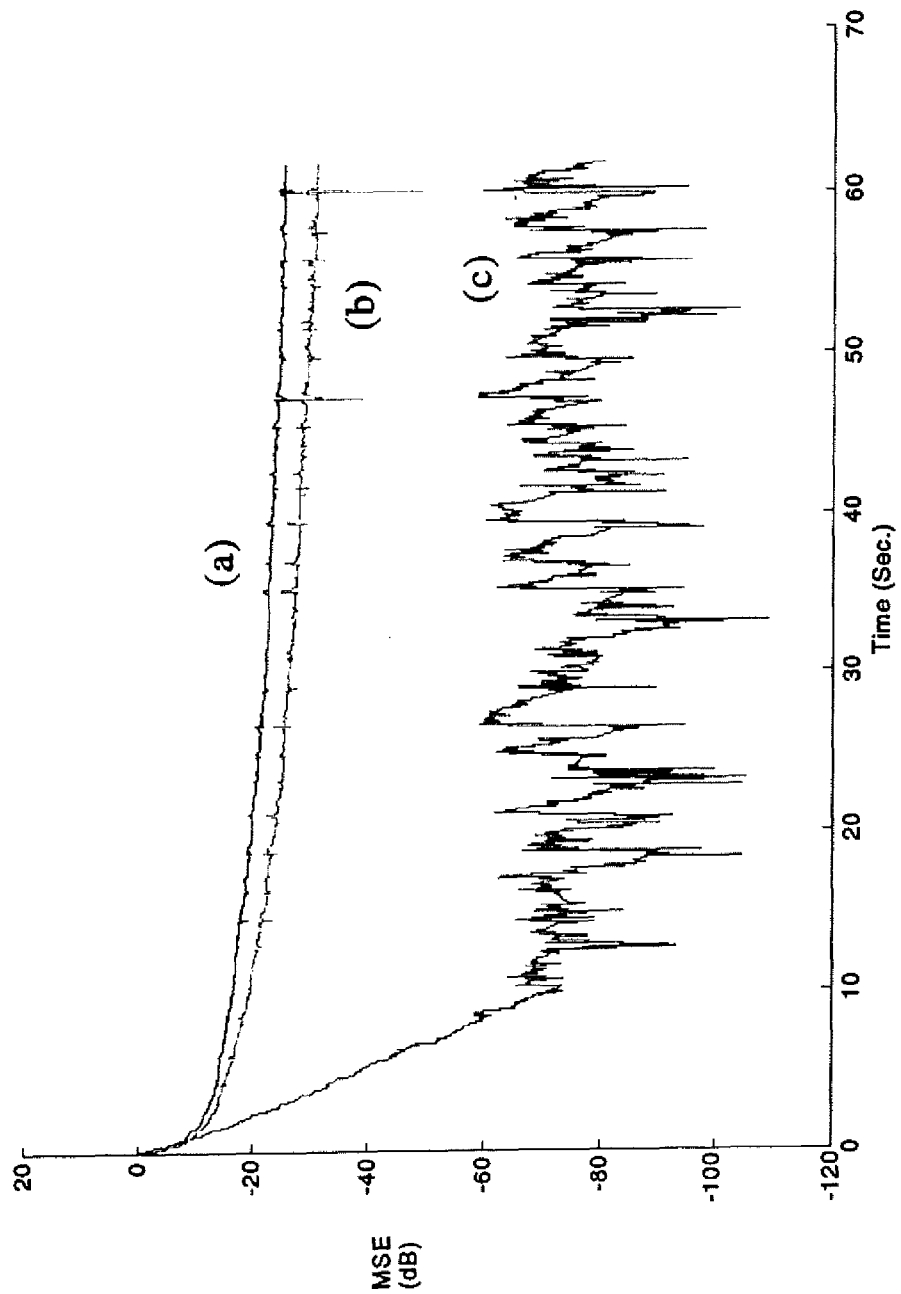
FIG. 6 is a graph showing an average normalized filter MSE (measured mean-squared error) for speech in 0 dB SNR White noise for no whitening, whitening by spectral emphasis, and whitening by decimation.

FIG. 6 shows an average normalized filter MSE (mean-square error) for speech in 0 dB SNR White noise. In FIG. 6, (a) represents MSE without whitening, (b) represents MSE for whitening by spectral emphasis, and (c) represents MSE for whitening by decimation. The SAF system is used for noise cancellation, in which the SAF system receives inputs from 2-microphone. In this case, whitening by decimation converges faster than the other two methods. Since the adaptive filter operates at low frequency, whitening by decimation requires less computation than whitening by spectral emphasis or whitening by adding noise.

Detailed mathematical models of SAF systems are described in S. Weiss, "On Adaptive Filtering in Oversampled Sub-bands", PhD. Thesis, Signal Processing Division, University of Strathclyde, Glasgow, May 1998, and S. Weiss et al., "Polyphase Analysis of Subband Adaptive Filters", 33$^{rd}$ Asilomar Conference on Signals, Systems, and Computers, Monterey, Calif., 1999.

Figure 7:
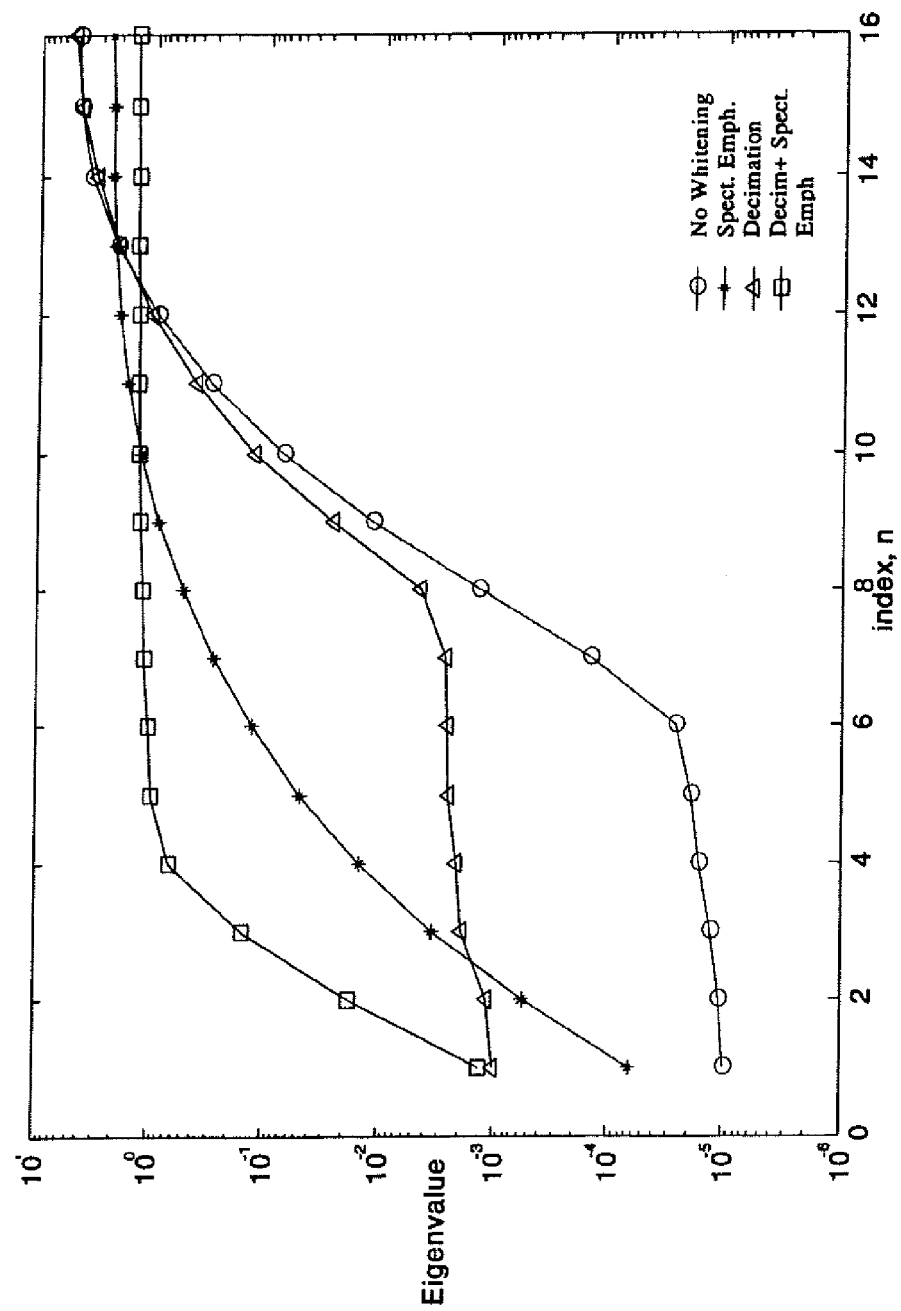
FIG. 7 is a graph showing eigenvalues of the autocorrelation matrix of the reference signal for no whitening, whitening by spectral emphasis, whitening by decimation, and whitening by decimation and spectral emphasis.

FIG. 7 shows the theoretical eigenvalues of the autocorrelation matrix of the reference signal for: no whitening; whitening by spectral emphasis; whitening by decimation; and whitening by decimation and spectral emphasis. The eigenvalues are calculated using an analytical formula given by the following reference: Dennis R. Morgan, "Slow Asymptotic Convergence of LMS Acoustic Echo Cancelers", *IEEE Trans. Speech and Audio Proc.*, Vol. 3, No. 2, pp. 126-136, March 1995. Small eigenvalues lead to slow convergence. The improvement can be seen at a low index area. As the result of the above technique, i.e., whitening by spectral emphasis, whitening by decimation or the combination of these methods, the eigenvalues become larger than that of no-whitening.

Figure 8:
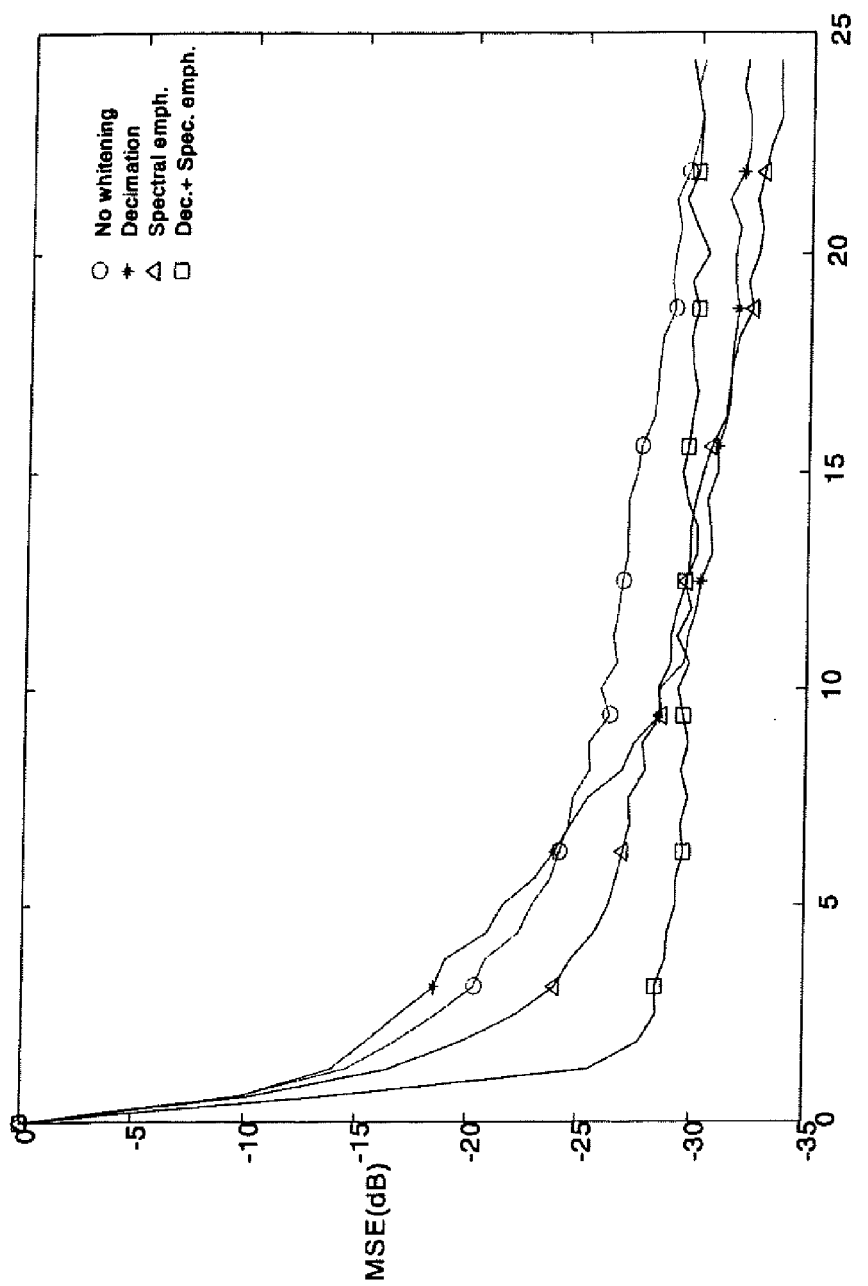
FIG. 8 is a graph showing MSE error for no whitening, whitening by spectral emphasis, whitening by decimation, and whitening decimation and spectral emphasis.
Figure 9:
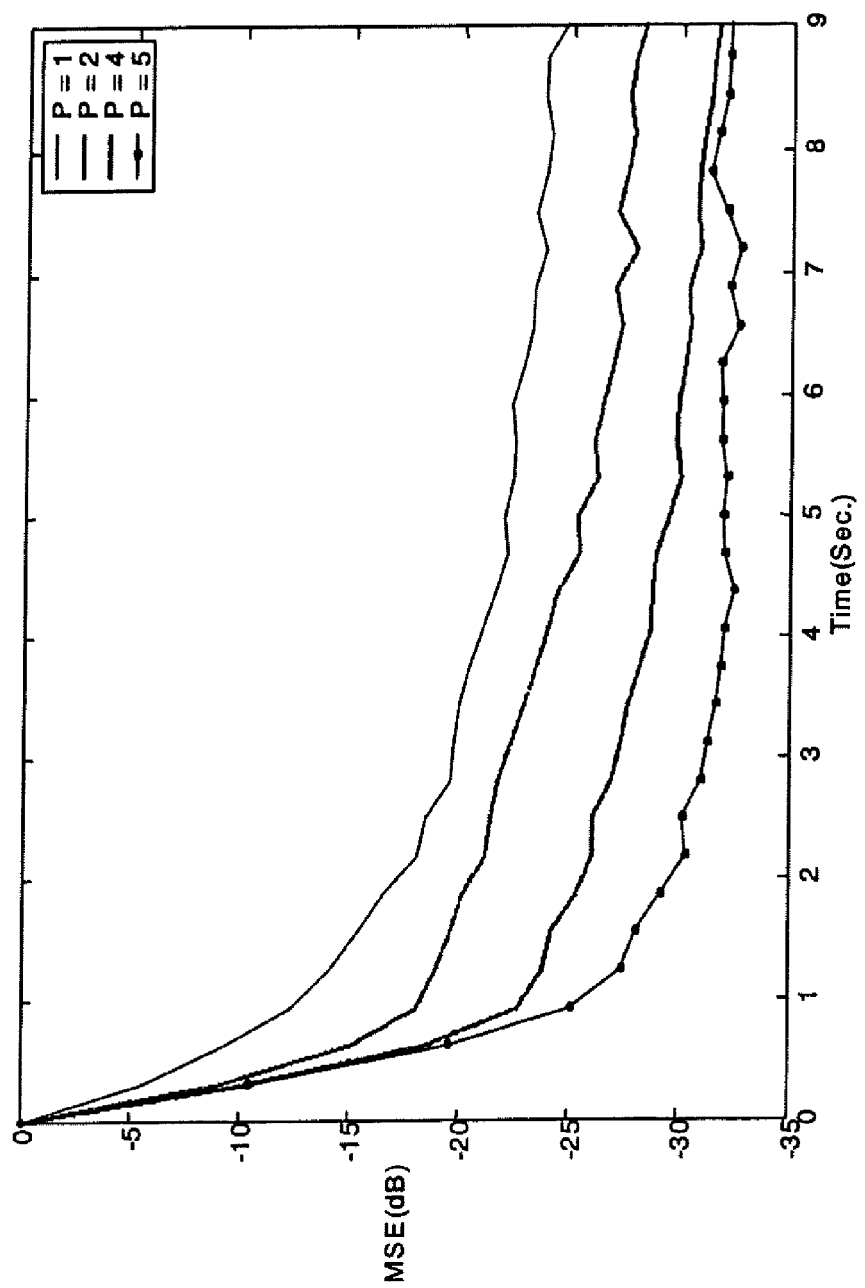
FIG. 9 is a graph showing MSE error for Affine Projection Algorithm (APA) with different orders.

In FIG. 7, while whitening by spectral emphasis and by decimation both offer improvement (demonstrated by a rise in the eigenvalues), a combination of both methods is more promising. This conclusion is confirmed by the mean-squared error (MSE) results shown in FIG. 8. FIG. 8 shows MSE error for: no whitening; whitening by spectral emphasis; whitening by decimation; and whitening by decimation and spectral emphasis. FIG. 9 shows the MSE error for APA with orders of P=1, 2, 4 and 5. The APA for P=1 yields an NLMS system. As shown, increasing the AP order, improves both the convergence rate and the MSE.

Fast adaptation techniques for echo cancellation are now described in detail. In echo cancellation, the long filter lengths, which are required because of the long duration associated with each echo path, may result in slow convergence. The fast adaptation techniques described below allow echo cancellation systems, which use long filter lengths, to cancel echo at high speed. The fast adaptation techniques may also be applicable to other applications, such as noise cancellation.

Figure 10:
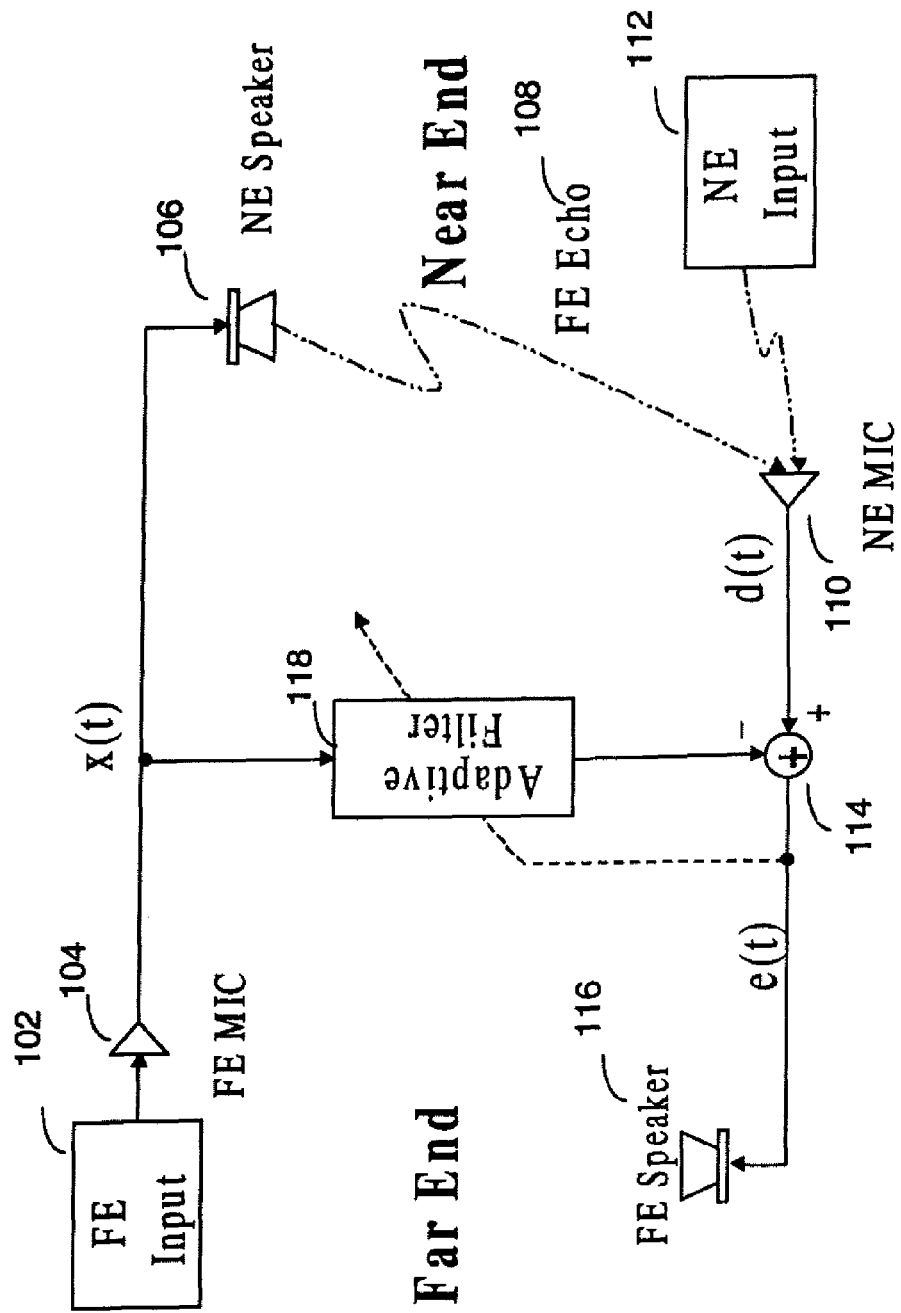
FIG. 10 is a block diagram showing an application of adaptive systems for echo cancellation.

FIG. 10 shows an application of adaptive systems for echo cancellation. A Far-End (FE) acoustic input signal 102 is converted to an electrical signal x(t) at a FE microphone (MIC) 104, which is sent to a Near-End (NE) speaker 106. The NE microphone (MIC) 110 then receives an acoustic echo signal 108 (referred to as FE echo) from the NE speaker 106. The NE microphone 110 also receives NE input signal 112 (e.g., speech and noise), and converts the total signal (=FE echo 108+NE input 112) to an electric signal d(t). The electrical signal x(t) is provided to an adaptive filter 118. The adder 114 adds the electrical signal d(t) and the output of the adaptive filter 118 for producing an error signal e(t). The adaptive filer 118 minimizes the error signal e(t) to eliminate the FE echo 108. Once convergence has been achieved, the adaptive filter 118 essentially models the transfer function of the NE speaker 106 and NE microphone 110, as well as the transfer function of the acoustic path between the NE speaker 106 and the NE microphone 110. Echo may also be generated by electrical signals leaking back to the FE side through various (undesired) electrical paths between the FE and the NE sides. In the following description, acoustical echo is discussed. However, the techniques described cover acoustical echo, electrical echo and a combination thereof.

Figure 11:
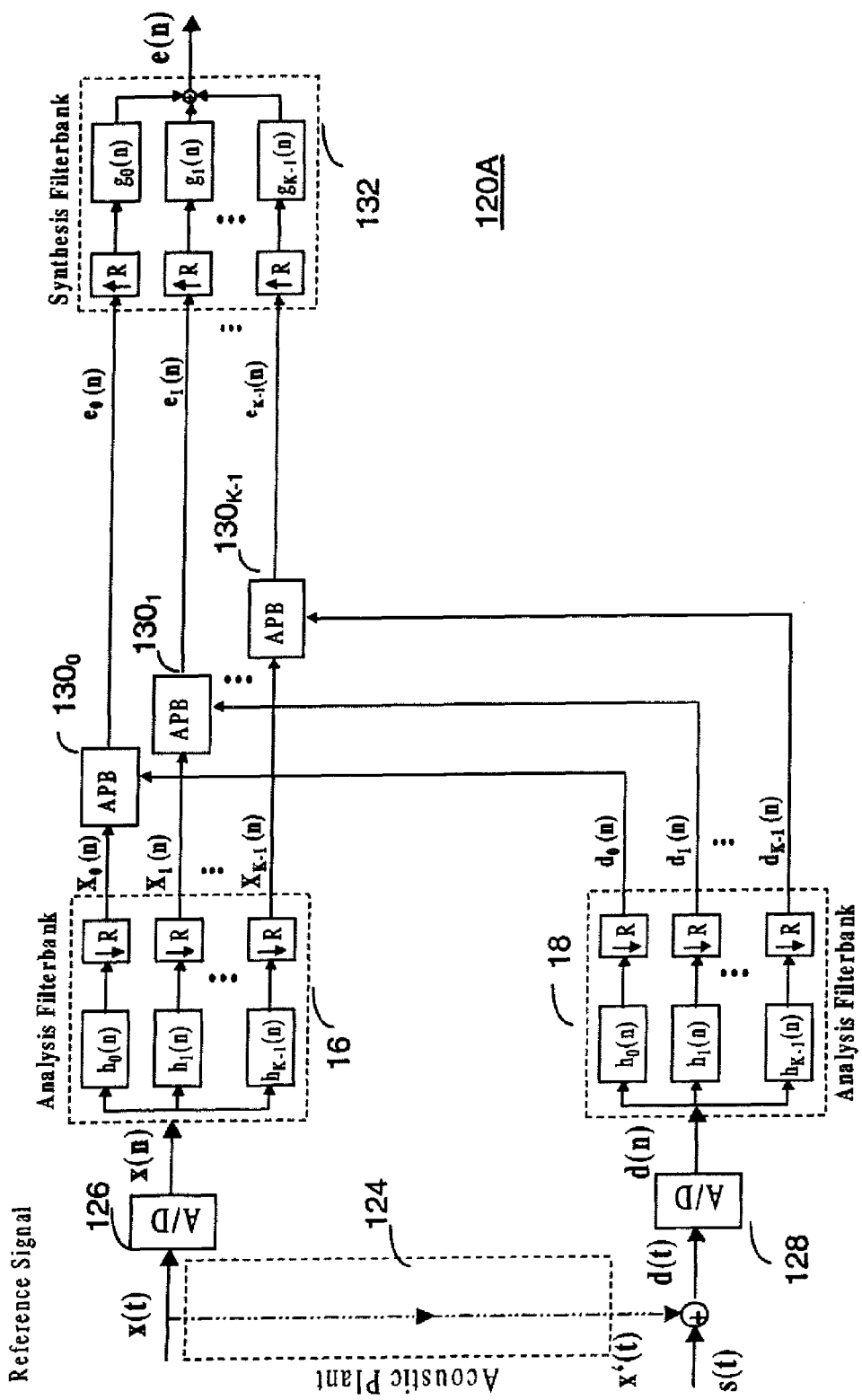
FIG. 11 is a block diagram showing an oversampled SAF system for echo cancellation in accordance with a first embodiment of the present invention.

FIG. 11 shows an oversampled SAF system 120A for echo cancellation in accordance with a first embodiment of the present invention. The oversampled SAF system 120A is applied to the system of FIG. 10, and is implemented in the subband domain.

The oversampled SAF system 120A includes an SAF system for echo cancellation, which has a plurality of adaptive processing blocks (APB) $130_i$ (i=0, 1, ..., K−1). The system 120A receives signals x(t) and s(t). The signal x(t) is converted to a signal x'(t) through an acoustic plant 124 (e.g., P(z) 12 in FIGS. 1-3). The signal x'(t) may be an echo signal. The signals x(t) and d(t) (=the signal x'(t)+the signal s(t)) are sampled at A/D converters 126 and 128, respectively. The outputs x(n), d(n) of the A/D converters 126 and 128 are analyzed by the WOLA analysis filterbanks 16 and 18 to obtain complex frequency-domain subband signals $x_i(n)$ and $d_i(n)$ (i=0, 1, ..., K−1) where K is the number of subbands. The subband signal is processed using an adaptive processing block (APB). Pairs of $[x_i(n), d_i(n)]$ are inputs to the APB $130_i$ (i=0, 1, ..., K−1), which outputs complex subband signals $e_i(n)$. The complex subband signals $e_i(n)$ are then combined in a WOLA synthesis filterbank 132, which outputs a time-domain echo-cancelled signal e(n).

The APB blocks $130_0, 130_1, \ldots, 130_{K-1}$ may employ any of the convergence improvement techniques described above, e.g., whitening by spectral emphasis, whitening by adding noise, whitening by decimation, Affine projection algorithm, or a combination of two or more of these techniques, to achieve fast convergence.

Figure 12:
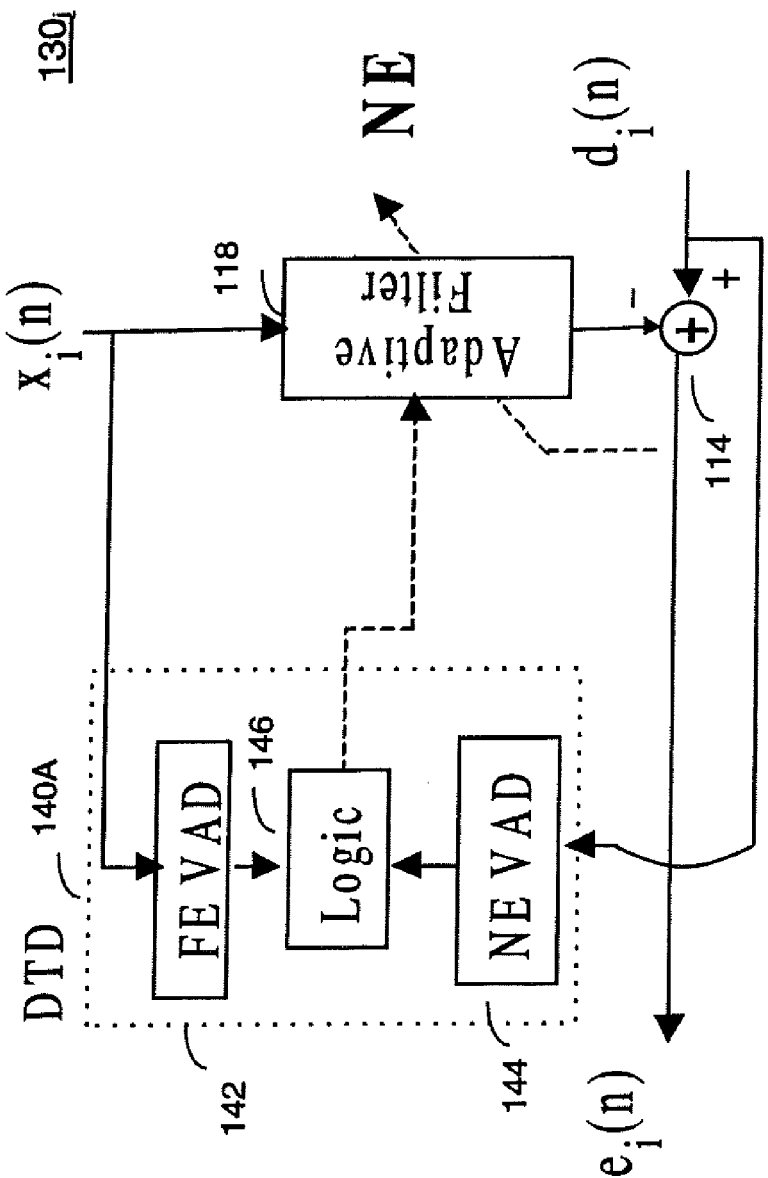
FIG. 12 is a block diagram showing a first embodiment of an adaptive processing block (APB) of FIG. 11.

FIG. 12 shows a first embodiment of the APB of FIG. 11. In FIG. 12, the APB for subband i is illustrated. The APB $130_i$ of FIG. 12 includes a Double-Talk Detector (DTD) 140A to control the adaptation process of the adaptive filter 118. The DTD 140A includes FE and NE voice-activity detectors (VADs) 142 and 144. The FE VAD 142 operates on the FE signal. The NE VAD 144 employs the signal $d_i(n)$. It also contains logic 146 that specifies, based on the two VAD decisions, when double-talk (both NE and FE sides talking), single-talk (only one of the FE or NE sides talking) or common-pause (none of the two sides talking) situations occur. The DTD 140A allows quick adaptation of the adaptive filter 118 only during FE single-talk. In other situations, it stops or slows down the adaptation.

Figure 13:
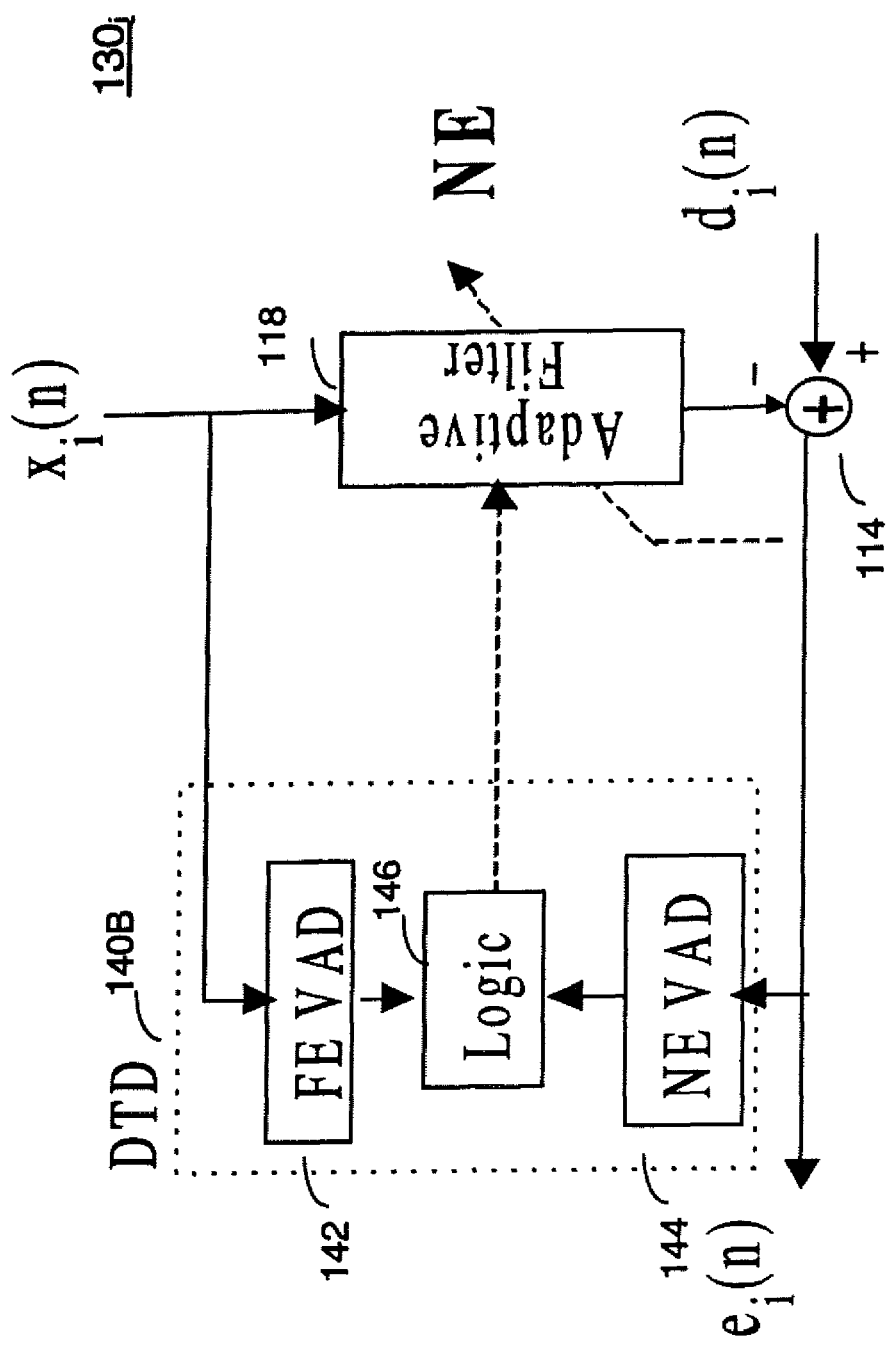
FIG. 13 is a block diagram showing a second embodiment of the APB of FIG. 11.

FIG. 13 shows a second embodiment of the APB of FIG. 11. In FIG. 13, the APB for subband i is illustrated. The APB $130_i$ of FIG. 13 includes a DTD 140B. In the DTD 140B, the error signal $e_i(n)$ output from the adder 114 is applied to the NE VAD 144. The rational behind using the error signal is as follows. At the start of the adaptation process, the error signal $e_i(n)$ is almost the same as $d_i(n)$ since the adaptive filter 118 is identically all zeros. As the DTD 140B allows the adaptive filter 118 to adapt, more of the echo is cancelled from $d_i(n)$. As a result, the DTD 140B detects more instances of FE single-talk and the adaptive filter 118 obtains more chances to further adapt. This in turn will cancel echo more efficiently. This looping technique improves the performance of the DTD 140B and, as a result, improves the echo cancellation system (120A). This strategy is particularly helpful when there are high levels of echo.

Figure 14:
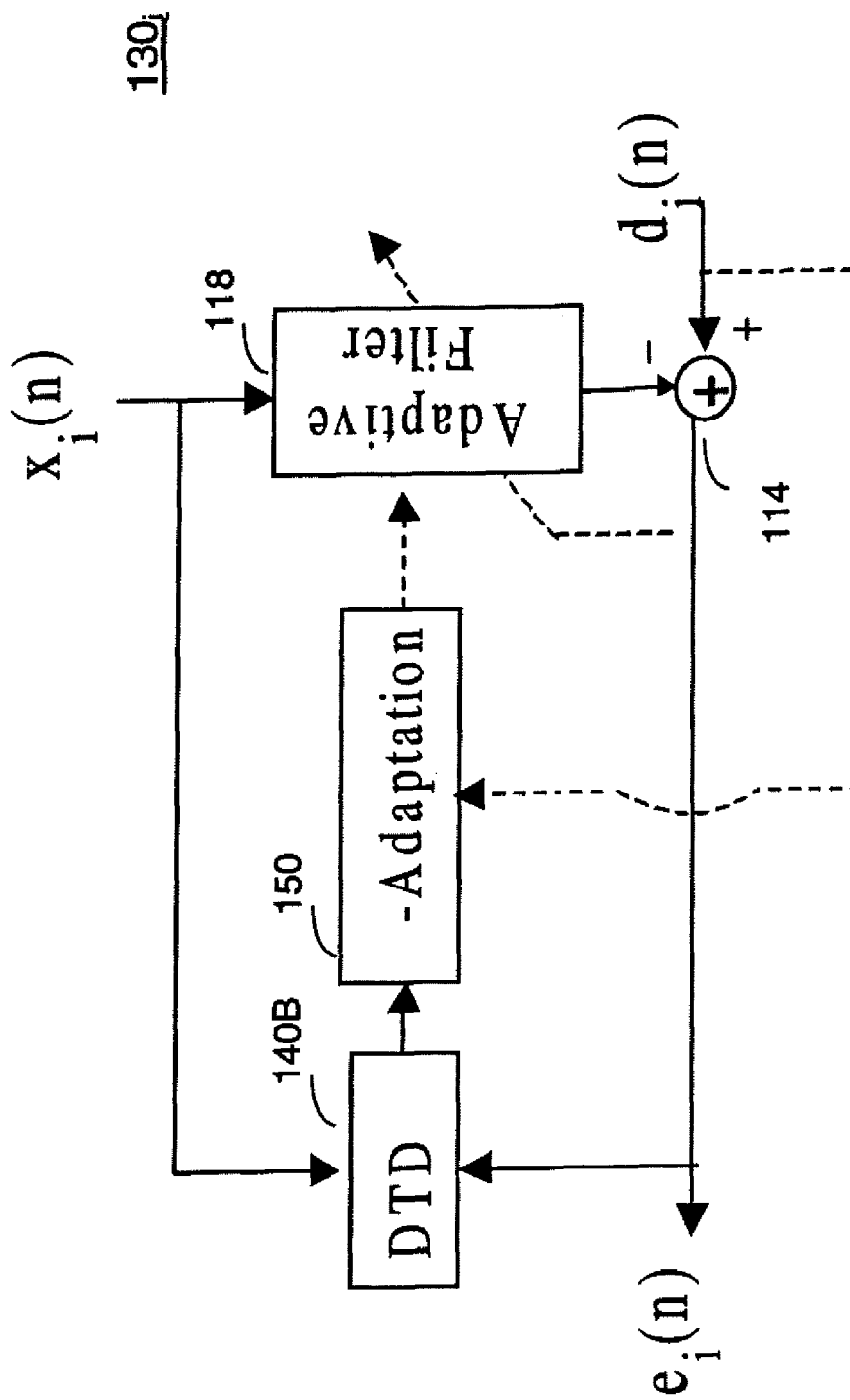
FIG. 14 is a block diagram showing a third embodiment of the APB of FIG. 11.

FIG. 14 shows a third embodiment of the APB of FIG. 11. In FIG. 14, the APB for subband i is illustrated. The APB $130_i$ of FIG. 14 contains the DTD 140B and a μ-adaptation block 150 for controlling the step-size of the adaptive filter 118. The NE signal may contain both speech and noise, and the NE noise may be present even when the DTD detects a FE single-talk situation. This would create problems for the adaptive processor if a large adaptation step-size (μ) were chosen. The μ-adaptation block 150 is provided to condition the adaptation step-size on the level of the FE echo (FEE) signal relative to the level of the NE noise (NEN) signal, i.e. on the ratio of $|FEE|^2/|NEN|^2$. That allows the adaptive filters 118 to achieve fast adaptation when the NE noise is present.

An estimate of the NEN energy is obtained by measuring the energy of $d_i(n)$ in common-pause. To estimate energy of the FEE, one can subtract the NEN energy estimate from energy of $d_i(n)$ during FE single-talk, i.e.:

$|d_i(n)|^2$ in common-pause → $|NEN|^2$ estimate $|d_i(n)|^2$ in FE single talk − $|NEN|^2$ estimate → $|FEE|^2$ estimate Based on the results of the DTD 140B and the estimate of $|FEE|^2/|NEN|^2$, the μ-adaptation block 150 varies the value of the step-size. Various strategies are possible to adapt the step-size. Generally as the ratio of $|FEE|^2/|NEN|^2$ increases, larger step-sizes are employed.

Figure 15:
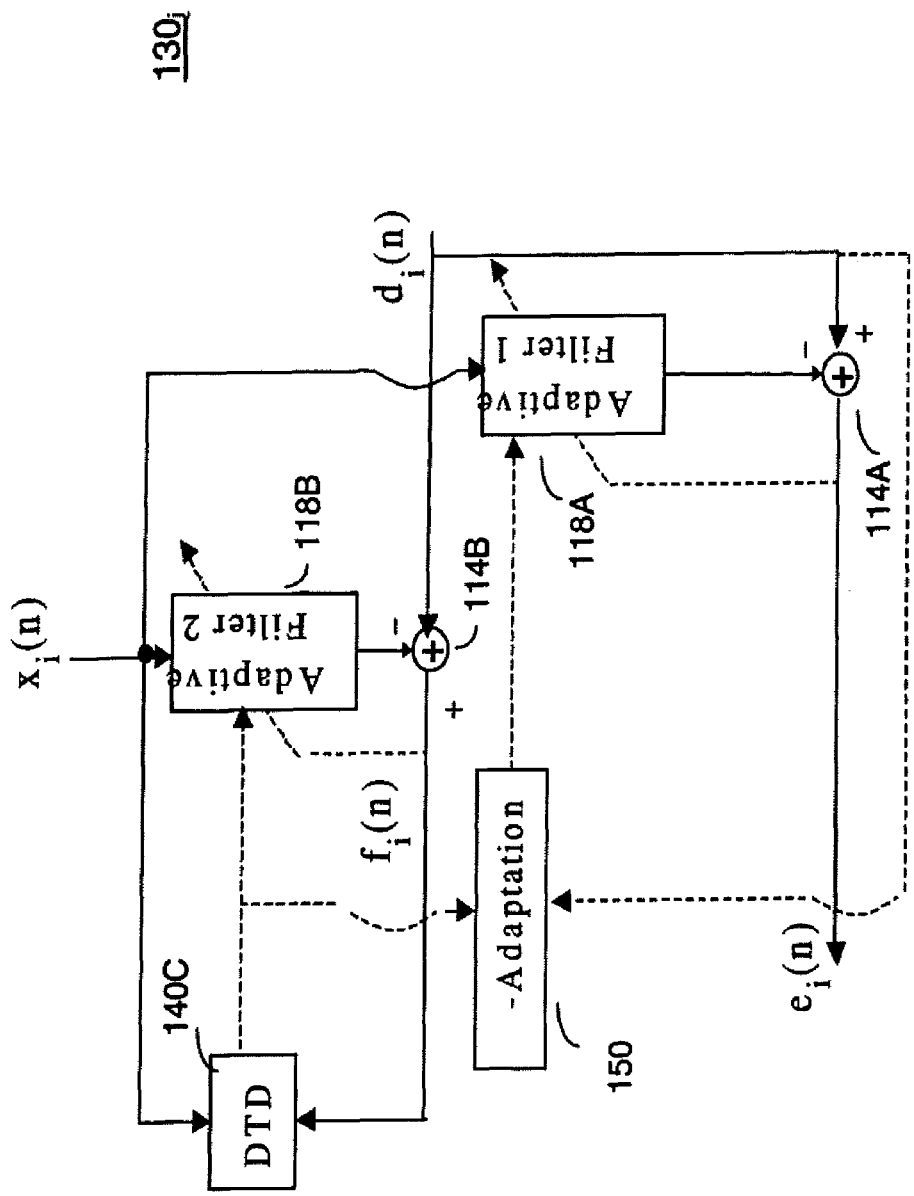
FIG. 15 is a block diagram showing a fourth embodiment of the APB of FIG. 11.

FIG. 15 shows a fourth embodiment of the APB of FIG. 11. In FIG. 15, the APB for subband i is illustrated. The APB $130_i$ of FIG. 15 includes two adaptive filters 118A and 118B, and adders 114A and 114B. The signal $x_i(n)$ is applied to the adaptive filters 118A and 11BB. The adaptive filter 118B contains a low-order filter that is basically used for the DTD 140C. The DTD 140C is similar to the DTDs 140A-140B. The adder 114B adds the output of the adaptive filter 118B and the signal $d_i(n)$, and outputs a signal $f_i(n)$. The signals $x_i(n)$ and $f_i(n)$ are applied to the DTD 140C. The DTD 140C controls the adaptation process of the adaptive filter 118B, and also controls the adaptation process 118A via the μ-adaptation block 150. The μ-adaptation block 150 controls the adaptation step size of the adaptive filter 118A based on the decision of the DTD 140C and the estimation. The adaptive filter 118A works with the μ-adaptation block 150 and performs similar to the adaptive filter 118 of FIG. 14.

The low-order adaptive filter 11BB may adapt faster than the adaptive filter 118A. The NE VAD of the DTD 140C would perform well even before full convergence of the adaptive filter 118A. Most of the echo would be eliminated quickly at its output ($f_i(n)$).

When an adaptive filter employed for echo cancellation has high filter orders due to long echo paths, the adaptive filter may converge slowly. However, in FIG. 15, the low-order adaptive filter 118B is provided to modify the input to the DTD 140C. Thus, the APB of FIG. 15 allows the echo cancellation system (120A) to achieve fast echo cancellation.

Combination of adaptive and non-adaptive processing for noise and echo cancellations is now described in detail.

It is well-known that the (optimum) adaptive filter is estimated as follows (Haykin, S., *Adaptive Filter Theory*. Prentice Hall, Upper Saddle River, $3^{rd}$ Edition, 1996):

$$W^*(f) = \frac{P_{xd}(f)}{P_{xx}(f)} \quad (1)$$

where $$P_{xd}(f) = \sum_k r_{xd}(k) e^{-j2\pi f} \quad (2)$$

and $r_{xd}(k)$ is the cross-correlation of input signals x(n) and d(n) at delay k. The cross correlation plays a major role in estimating the transfer function between two inputs. In the case of weak correlation, the adaptive filter only removes the correlated portion of the noise and leaves the uncorrelated part intact.

It is assumed that the input signal d(n) contains only noise and there is no speech signal present. The valid feature to characterize the correlation of two noise signals x(n) and d(n) is the coherence function $G_{xd}(f)$ which is described in the following equation (3) (M. M. Goulding, "Speech enhancement for mobile telephony," IEEE Trans. Vehicular Tech., vol. 39, no. 4, pp. 316-326, November 1990):

$$G_{xd}(f) = \frac{|P_{xd}(f)|^2}{P_{xx}(f) \cdot P_{dd}(f)} \quad (3)$$

For each frequency f, equation (3) characterizes the correlation of two input signals by a value between 0 and 1 and consequently, determines the amount of noise that can be cancelled in that frequency through adaptive filtering. More precisely, the noise reduction factor NR(f) of adaptive filtering meets the following equation (4):

$$NR(f) = \frac{\text{input noise power at frequency } f}{\text{output noise power at frequency}} = \frac{1}{1 - G_{xd}(f)}. \quad (4)$$

In a diffuse noise field, two microphones receive noise signals from all directions equal in amplitude and random in phase. This results in a squared Sinc (magnitude squared) coherence function for diffuse noise field as described in A. G. Piersol, "Use of coherence and phase data between two receivers in evaluation of noise environments," Journal of Sound and Vibration, vol. 56, no. 2, pp. 215-228, 1978.

$$G_{xd}(f) = \frac{\sin^2(2\pi f d/c)}{(2\pi f d/c)^2} = \text{Sinc}^2\left(\frac{2fd}{c}\right) \quad (5)$$

where d is the microphone spacing and c is the sound velocity (c=340 m/s).

Figure 16:
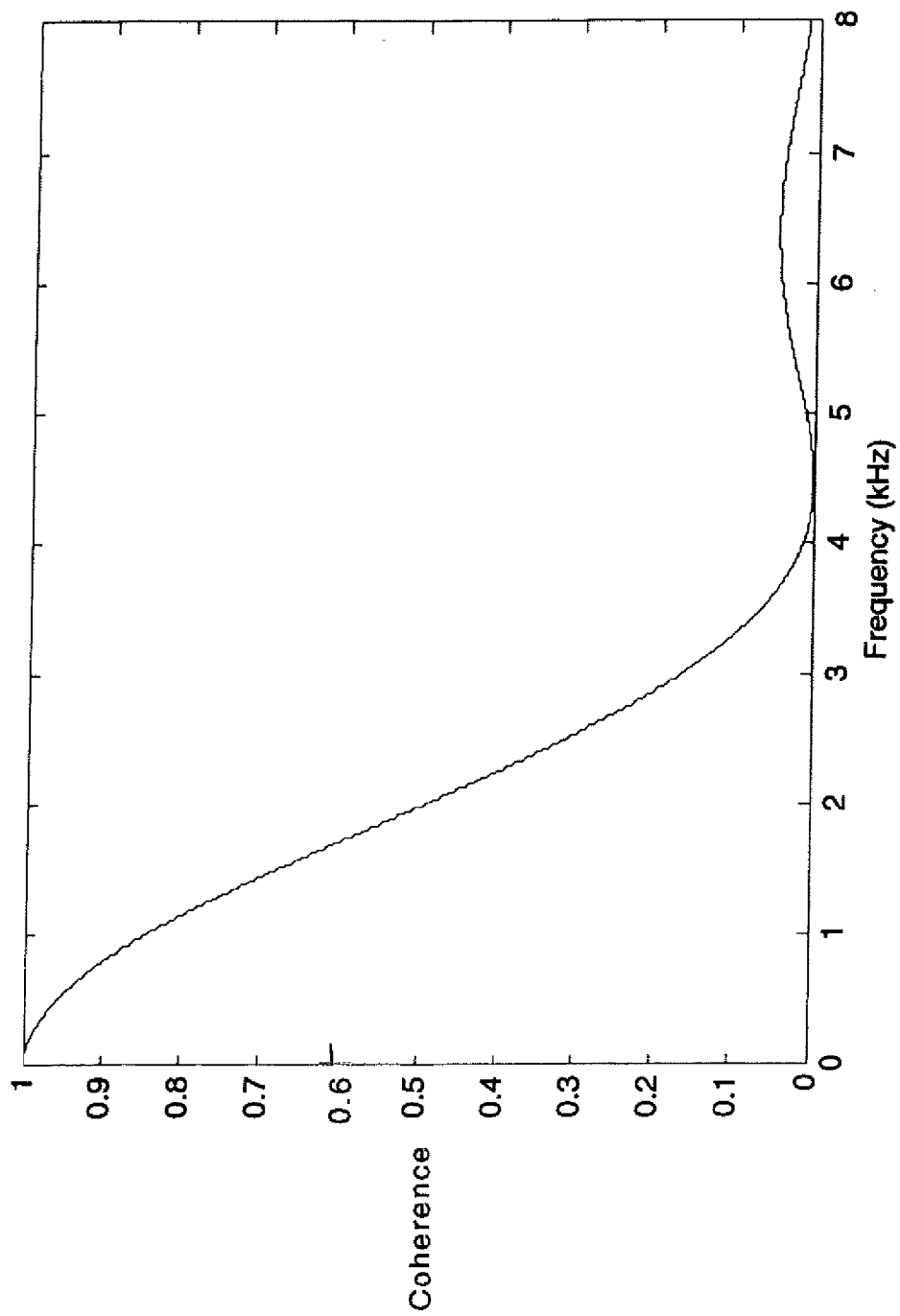
FIG. 16 is a graph showing the coherence function of diffuse noise.

FIG. 16 shows the coherence function of a diffuse noise for d=38 mm. According to this coherence function, increasing microphone spacing d, will decrease the noise reduction capability of adaptive filter in more subbands. Although a decrease in distance of two microphones can be proposed as a remedy, this greatly intensifies the cross-talk problem described below.

Many practical noise fields are diffuse. As a result, the noises recorded by the two microphones are only coherent at low frequencies. This implies that an SAF system for noise cancellation may only partially remove the noise from d(n). There are some other possible scenarios where the two noises present at the two microphones do not have a flat coherence function (of value 1) across various frequencies. In such cases, the SAF system may only partially enhance the signal.

Figure 17:
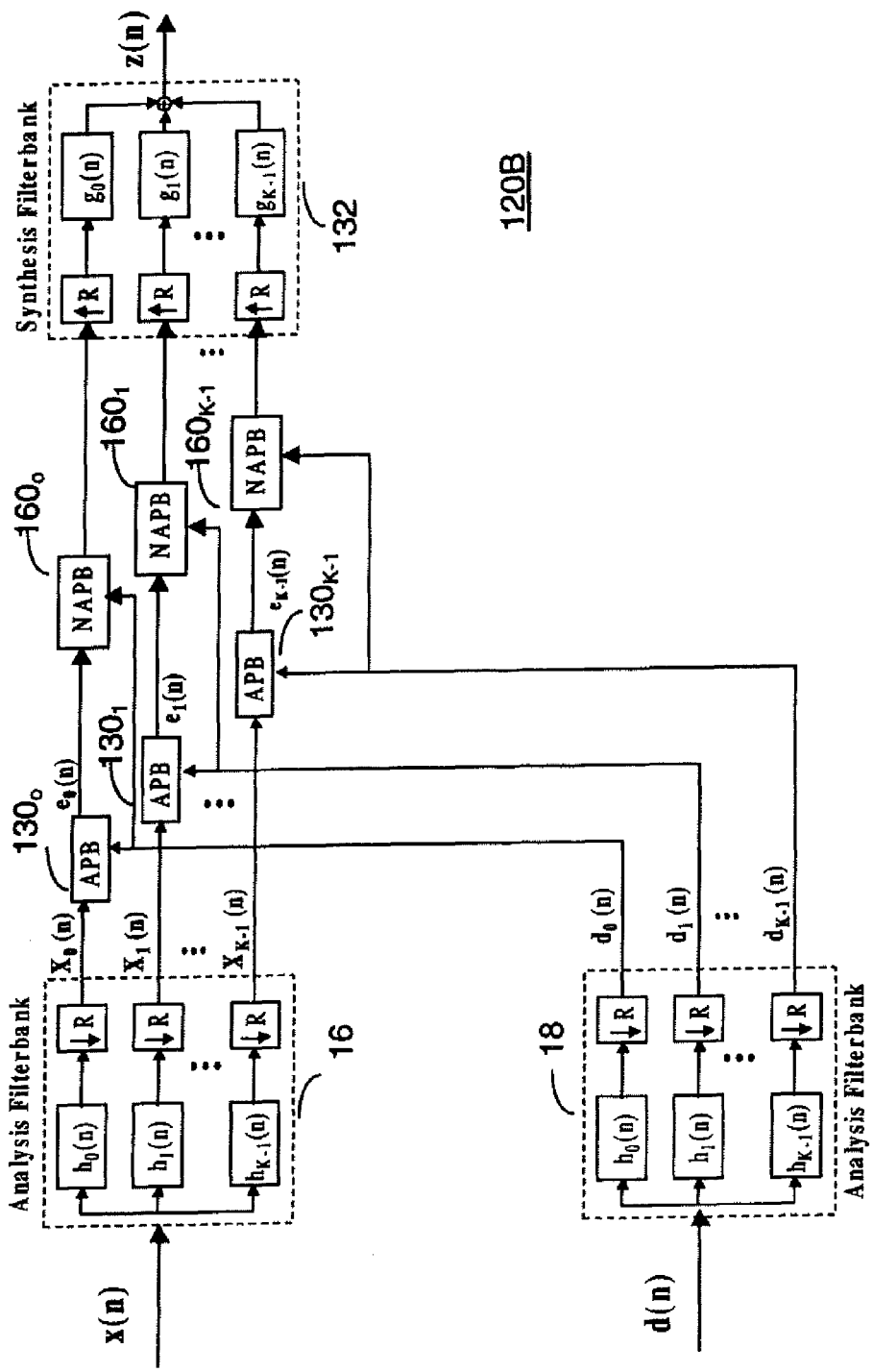
FIG. 17 is a block diagram showing an oversampled SAF system in accordance with a second embodiment of the invention.

FIG. 17 shows an oversampled SAF system 120B in accordance with a second embodiment of the present invention. The oversampled SAF system 120B deals with both correlated and non-correlated noises in the inputs x(n) and d(n). The oversampled SAF system 120B is also applicable to echo cancellation where a desired signal is affected by correlated echo and non-correlated echo. The oversampled SAF system 120B includes non-adaptive processing block (NAPB) $160_i$ in each subband. The NAPB $160_i$ is provided to each APB $130_i$. The NAPB $160_i$ performs single-mic or two-mic non-adaptive noise reduction.

Figure 18:
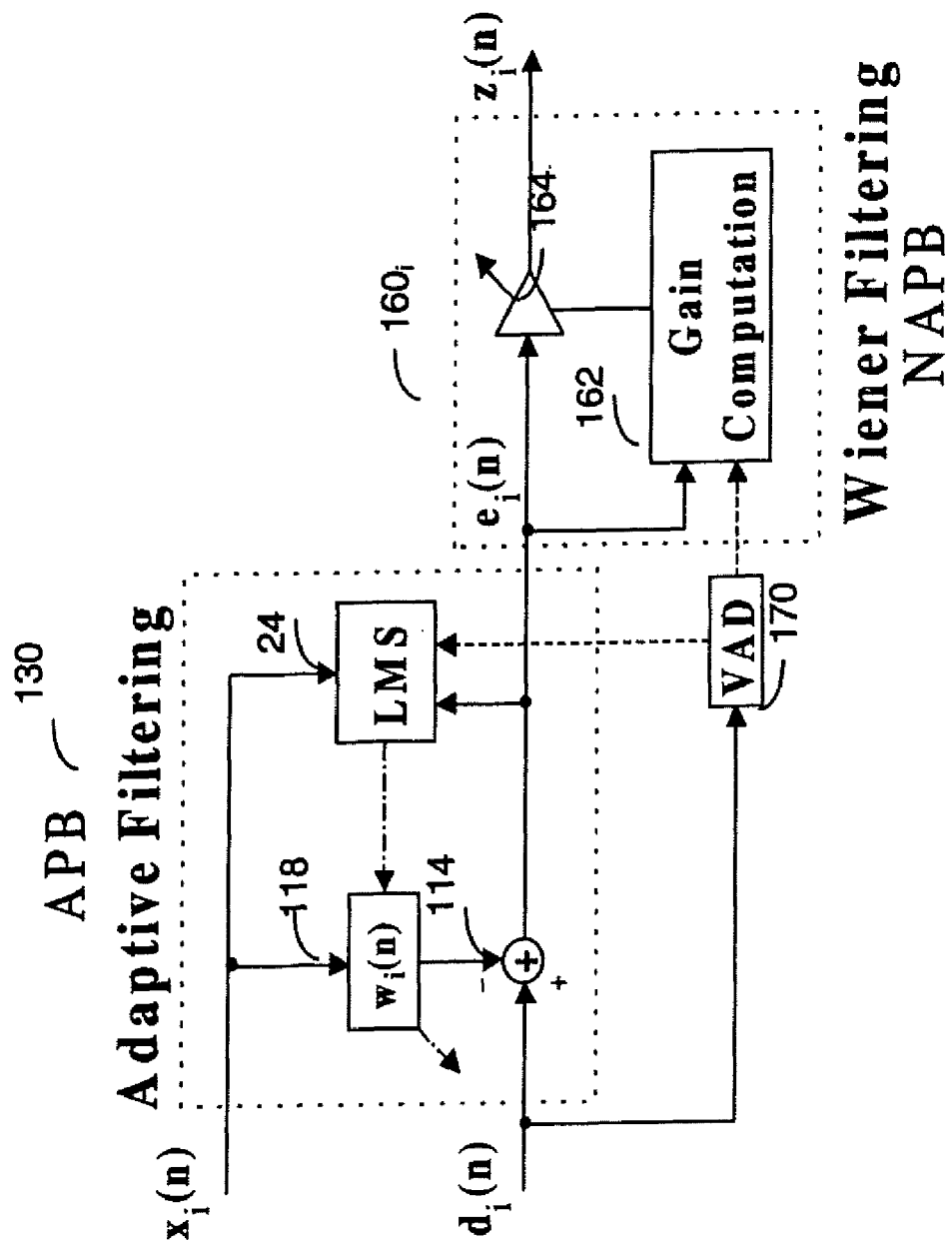
FIG. 18 is a block diagram showing one embodiment of an adaptive processing block (APB) and a non-adaptive processing block (NAPB) of FIG. 17.

FIG. 18 shows a first embodiment of the APB and the NAPB of FIG. 17. In FIG. 18, the APB and NAPB for subband i is illustrated. The NAPB $160_i$ of FIG. 18 is a single-microphone Wiener filter used to eliminate the residual uncorrelated noise at the output of the APB $130_i$.

The APB $130_i$ of FIG. 18 has the adder 114, the adaptive filter ($w_i(n)$) 118 and the LMS block 24 which receives the signal $x_i(n)$ and the output $e_i(n)$ of the adder 114 to adjust the adaptive filter 118. The NAPB $160_i$ of FIG. 18 estimates an (original) error signal $z_i(n)$ from a degraded version of the error signal $e_i(n)$ by Wiener filtering. The error signal $e_i(n)$ is used for gain computation 162 to adjust the gain of the adaptive filter 164. The Wiener filter of the NAPB $160_i$ constantly changes the weights in the filter 164 to maximize the signal-to-noise ratio. The error signal $e_i(n)$ includes residual uncorrelated noise which have not been removed in the APB $130_i$. The Wiener filter of the NAPB $160_i$ further suppresses this noise using the single signal $e_i(n)$ and the decision provided by a VAD 170. The VAD 170 is provided to control LMS computation in the APB $130_i$ and the gain computation 162 in NAPB $160_i$.

Other single-mic or two-mic noise reduction strategies are also possible. Since the correlated noise is already eliminated by the APB stage, the artifacts and distortions due to the NAPB will have less degrading effects at the output than if NAPB was used alone. NAPB works best when it is called upon to remove mild interference. For diffuse noises, the important low-frequency region of speech signal will not be distorted since the low-frequency noises at the two mics are correlated and will be eliminated mostly by the APB stage without generating artifacts.

Cross-Talk Resistant subband adaptive filtering for noise cancellation is now described in detail. When speech or a desired signal leaks into the reference (noise) microphone, i.e., in cross-talk, the performance of adaptive noise cancellation systems may be limited. To remedy this problem, cross-talk resistant adaptive noise canceller (CTRANC) in the time-domain has been proposed (G. Mirchandani et. al., "A new adaptive noise cancellation scheme in the presence of crosstalk", *IEEE trans. On Circuits and Systems, II: Analog and digital signal processing*, Vol. 39, No. 10, October 1992, pp. 681-694).

Figure 19:
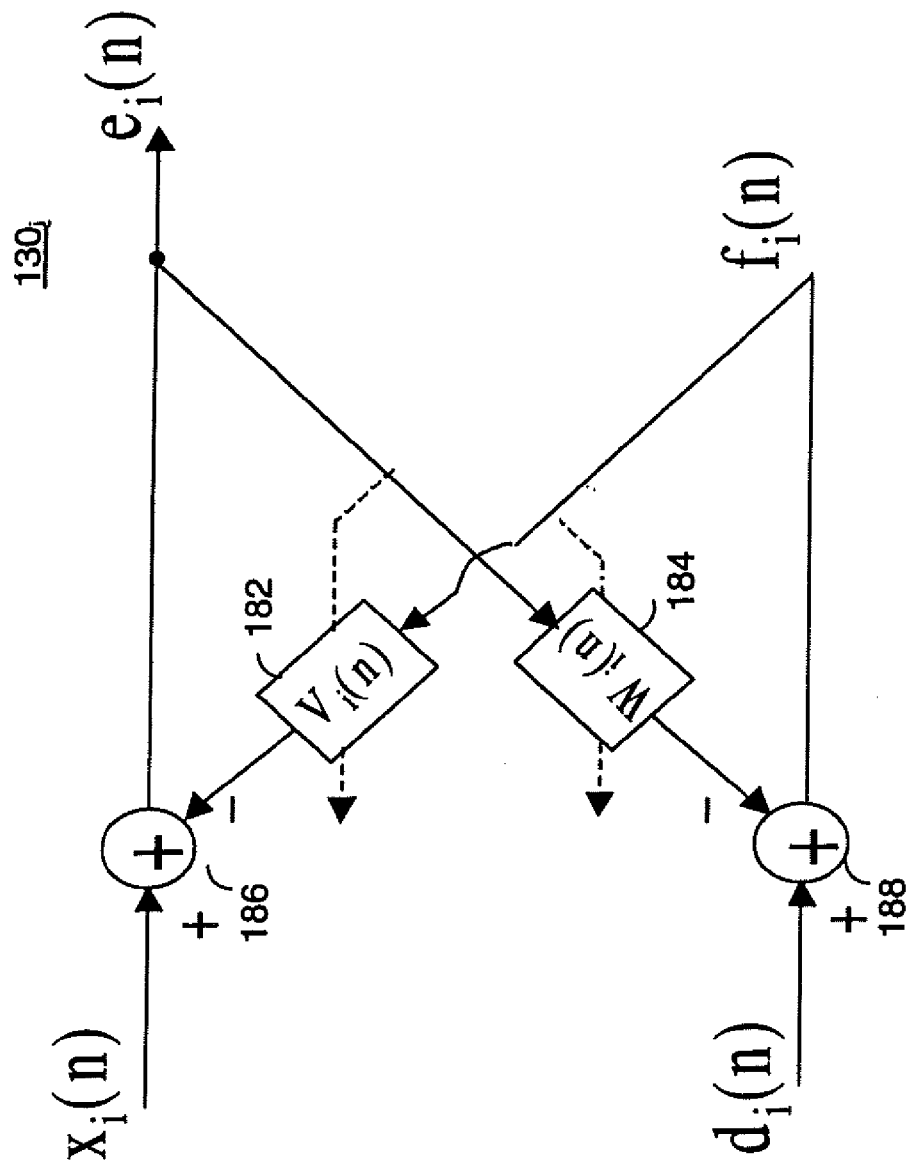
FIG. 19 is a block diagram showing a cross-talk resistant APB in accordance with an embodiment of the present invention.

An adaptive processing block (APB) with a CTRANC for processing oversampling subband signals is now described in detail. FIG. 19 shows a cross-talk resistant APB in accordance with an embodiment of the present invention. In FIG. 19, a CTRANC is implemented in the subband domain. The APB $130_i$ of FIG. 19 is applicable to the APB of FIG. 11 and FIG. 17. The APB $130_i$ in each subband has adaptive filters $V_i(n)$ 182 and $W_i(n)$ 184 and adders 186 and 188. The adder 186 adds the signal $x_i(n)$ and the output of the adaptive filter $V_i(n)$ 182. The output $e_i(n)$ of the adder 186 is applied to the adaptive filter $W_i(n)$ 184. The adder 188 adds the signal $d_i(n)$ and the output of the adaptive filter $W_i(n)$ 184. The output $f_i(n)$ of the adder 188 is applied to the adaptive filter $V_i(n)$ 182. The adaptive filter $V_i(n)$ 182 is adjusted in response to the signal $e_i(n)$. The adaptive filter $W_i(n)$ 184 is adjusted in response to the signal $f_i(n)$.

After convergence, the signal $e_i(n)$ provides the enhanced (subband) speech signal while the signal $f_i(n)$ provides the noise signal without speech interference.

Figure 20:
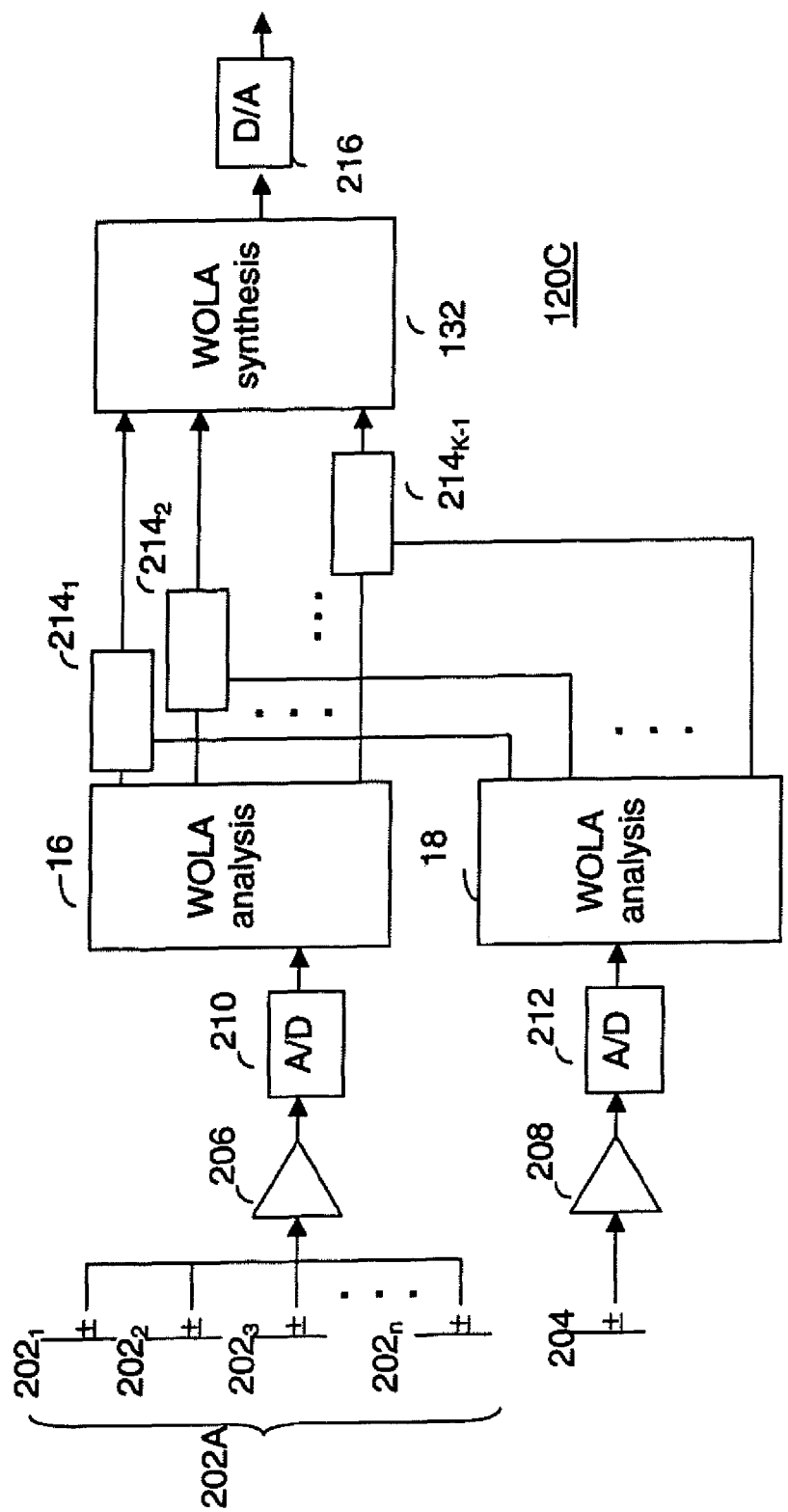
FIG. 20 is a diagram showing an oversampled SAF system in accordance with a third embodiment of the present invention.

FIG. 20 shows an oversampled SAF system 120C in accordance with a third embodiment of the present invention. The oversampled SAF system 120C includes a microphone array 202A for a primary signal, which has a plurality of microphones $202_j$ (j=1, 2, ..., n), and a microphone 204 for a reference signal. The output of the microphone array 202A is provided to a pre-amplifier 206. The output of the microphone 204 is provided to a pre-amplifier 208. The output of the pre-amplifier 206 is converted by an analog-to-digital (A/D) converter 210, and then provided to the WOLA analysis filterbank 16. The output of the pre-amplifier 208 is converted by an A/D converter 212, and then provided to the WOLA analysis filterbank 18. A subband processing block $214_i$ takes, as its input, the oversampled subband signals in subband i from the WOLA analysis filterbanks 16 and 18. The block $214_i$ may be similar to the subband processing blocks of FIGS. 1-3 and 5 or the APB of FIG. 11, or may have the NAPB of FIG. 17 or have the cross-talk resistant APB of FIG. 19.

The outputs of the subband processing block $214_i$ (i=0, 1, . . . , n) are combined by the WOLA synthesis filterbank 132. A digital-to-analog (D/A) converter 216 converts the output of the WOLA synthesis filterbank 132.

Figure 21:
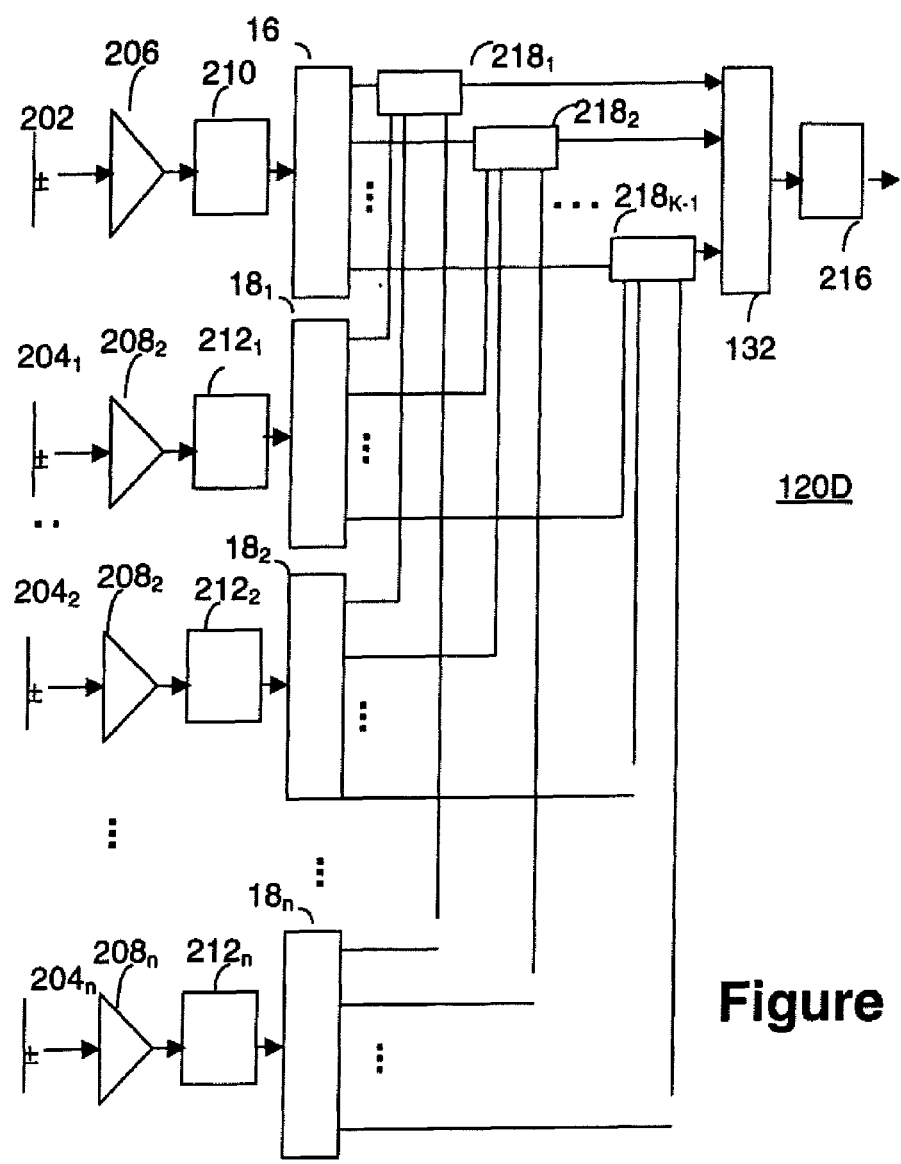
FIG. 21 is a diagram showing an oversampled SAF system in accordance with a fourth embodiment of the present invention.

FIG. 21 shows an oversampled SAF system 120D in accordance with a fourth embodiment of the present invention. The oversampled SAF system 120D processes a plurality of reference signals. The oversampled SAF system 120D includes a microphone array, which has a plurality of microphones $204_j$ (j=1, 2, . . . , n) for a plurality of reference signals, and a microphone 202 for a primary signal. The output of the microphone 202 is provided to the pre-amplifier 206. The output of the microphone $204_j$ is provided to the pre-amplifiers $208_j$. The output of the pre-amplifier 206 is converted by the A/D converter 210, and then provided to the WOLA analysis filterbank 16. The output of the pre-amplifier $208_j$ is converted by the A/D converter $212_j$, and then provided to the WOLA analysis filterbank $18_j$. A subband processing block $218_i$ takes, as its input, the oversampled subband signals in subband i from the WOLA analysis filterbank 16 and $18_1$, $18_2$, . . . , $18_n$. The block $218_i$ may be similar to the subband processing block of FIG. 20.

For example, the oversampled SAF system 120D is used for noise cancellation when there are more than one noise source. One microphone is used for each noise source to provide a reference signal.

Figure 22:
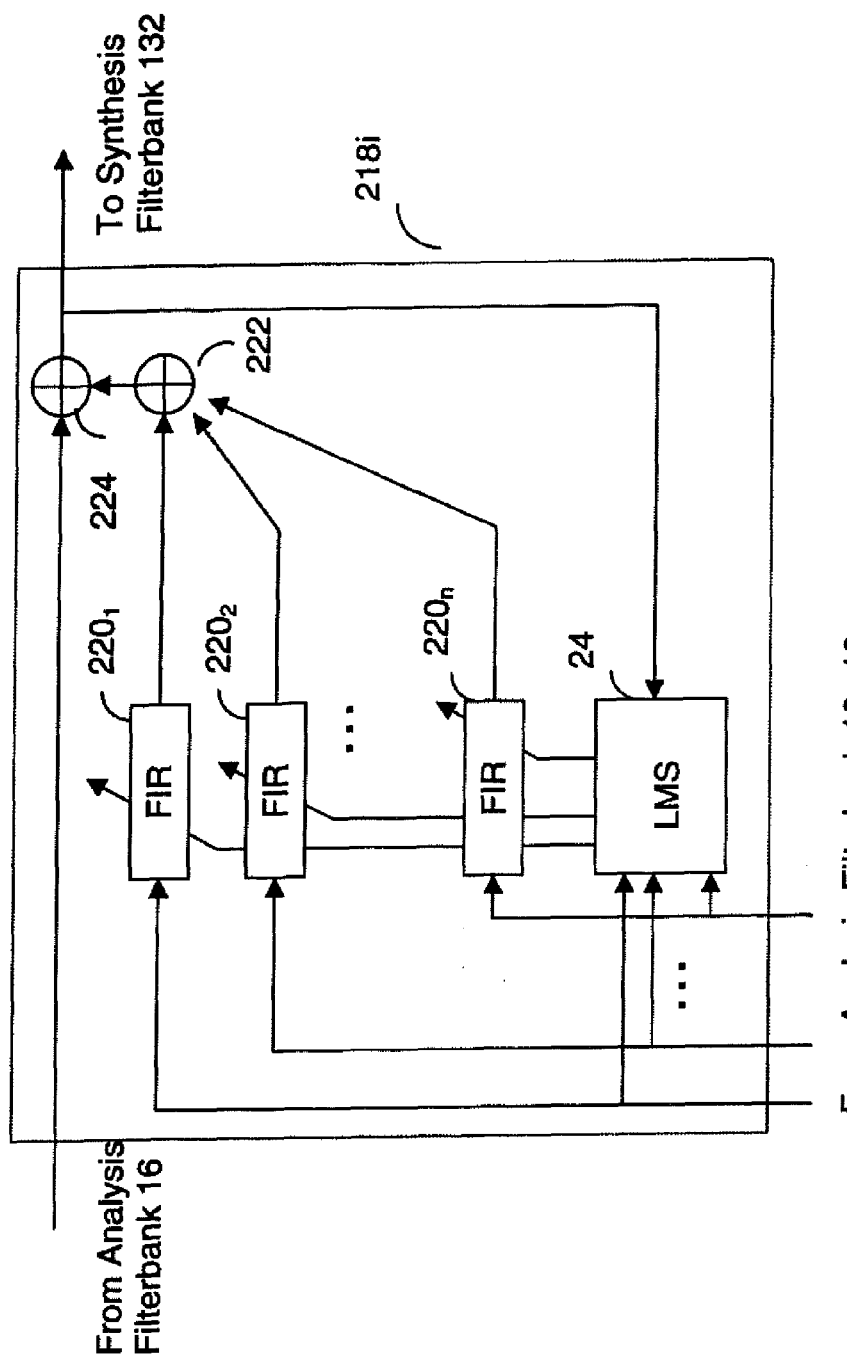
FIG. 22 is a diagram showing an example of the subband processing block of FIG. 21.

FIG. 22 shows an example of the subband processing block $218_i$ of FIG. 21. The subband processing block $218_i$ of FIG. 22 includes FIR filters $220_i$ (j=1, 2, . . . , n) and the LMS block 24. The filter $220_i$ takes, as its input, the output of the WOLA analysis filterbank $18_j$. An adder 222 adds the outputs from the filters $220_1$, . . . , $220_n$. An adder 224 adds the oversampled subband signal from the WOLA analysis filterbank 16 and the output of the adder 222. The reference signal is adaptively filtered and then subtracted from the primary signal. In FIG. 22, the FIR filter is shown. However, the filter $220_j$ may be an IIR filter or any other filter.

According to the present invention, the SAF system, which includes adaptive filters for processing oversampled subband signals, achieves fast convergence of the adaptive filters, high speed processing and low power consumption. Thus, the oversampled SAF system, implemented on a WOLA filterbank, is preferably applicable to echo cancellation and noise cancellation.

Subband adaptive signal processing in the WOLA filterbank permits the customization of algorithm parameters for individual frequency bands. For example, a noise cancellation algorithm may have filters that are set up to converge at different rates for different sub-bands. In addition, the adaptive filters may have different lengths. The increased number of possible parameters allows the system to be more effectively tuned according to the requirements of the application. In situations in which processing power is limited or is desired to be conserved, the update of the adaptive filter groups may be interleaved.

Furthermore, oversampling of the input signals permits the aliasing level in each subband to be virtually eliminated without employing cross-filters or gap filterbanks. To reduce the computation cost, a close to one non-integer decimation ratio may be used.

The embodiment of the present invention is not bound to any particular configuration of the oversampled WOLA filterbank (i.e., number of sub-bands, sampling rate, window length).

The SAF system, the oversampled SAF system, noise and/or echo cancellation system of the present invention may be implemented by any hardware, software or a combination of hardware and software having the above described functions.

While particular embodiments of the present invention have been shown and described, changes and modifications may be made to such embodiments without departing from the true scope of the invention.

The invention claimed is:

1. A method of processing subband signals for cancelling an undesired effect on a signal, the method comprising steps of:

analysing a primary signal and a reference signal in a time domain each through an oversampled filterbank to produce frequency domain primary signals and frequency domain reference signals in a plurality of subbands, where the primary signal is a desired signal affected by an undesired signal, and the reference signal corresponds to the undesired signal;

processing the frequency domain primary signal and the frequency domain reference signal using an adaptive filter in the processing in each subband, comprising:

filtering at the adaptive filter the frequency domain reference signal in each subband;

adding the filtered frequency domain reference signal and the frequency domain primary signal in each subband to output a subband signal in each subband; and operating on the frequency domain primary signal and the frequency domain reference signal in each subband to improve the convergence of the adaptive filter in each subband; and synthesizing the subband signals with an oversampled synthesis filterbank to output a time domain signal in which the subband processing has cancelled the effect of the undesired signal, the operating step including, in each subband:

whitening the frequency domain primary signal;

whitening the frequency domain reference signal; and adjusting coefficients of the adaptive filter based on the whitened frequency domain primary signal and the whitened frequency domain reference signal.

2. A method of claim 1, wherein the operating step includes the step of implementing the affine projection algorithm in each subband.

3. A method of claim 1, wherein the adjusting step comprises, in each subband:

adding the output of the adaptive filter and the whitened frequency domain primary signal to output a first signal; and implementing the least mean square algorithm, the recursive least squares algorithm, or a combination thereof based on the first signal and the whitened frequency domain reference signal to adjust the coefficients of the adaptive filter.

4. A method of claim 1, wherein the operating step includes the step of employing a double-talk detector to control the adaptation process of the adaptive filter.

5. A method of claim 1, wherein the operating step includes the step of controlling the adaptation step size of the adaptive filter.

6. A method of claim 1, wherein the processing step includes the step of performing non-adaptive noise reduction for eliminating uncorrelated noise.

7. A method of claim 1, wherein the processing step includes the step of performing a cross talk resistant adaptive processing using two adaptive filters in each subband.

8. A method of claim 1, wherein the undesirable signal is an echo signal or a noise signal.

9. A system for processing subband signals for cancelling an undesirable effect on a signal, the system comprising:
   an oversampled analysis filterbank for analysing a primary signal and a reference signal in a time domain to produce frequency domain primary signals and frequency domain reference signals in a plurality of subbands, where the primary signal is a desired signal affected by an undesired signal, and the reference signal corresponds to the undesired signal;
   a processing module for processing the frequency domain primary signals and the frequency domain reference signals, including:
      an adaptive filter module in the processing in each subband, for filtering the frequency domain reference signal in the subband;
      a first adder in each subband, for adding the filtered frequency domain reference signal and the frequency domain primary signal to output a subband signal in the subband; and
      a module for operating on the frequency domain primary signal and the frequency domain reference signal in each subband to improve the convergence of each adaptive filter; and
   an oversampled synthesis filterbank for synthesizing the subband signals to output a time domain signal in which the subband processing has cancelled the effect of the undesired signal,
   wherein the operating module includes:
      means for whitening the frequency domain primary signal in each subband; and
      means for whitening the frequency domain reference signal in each subband; and
      means for adjusting coefficients of the adaptive filter based on the whitened frequency domain primary signal and the whitened frequency domain reference signal, in each subband.

10. The system according to claim 9, wherein the module implements affine projection algorithm in each subband.

11. The system according to claim 9, wherein the adjusting module comprises, in each subband:
    a second adder for adding the output of the adaptive filter and the whitened frequency domain primary signal; and
    means for implementing the least mean square algorithm, the recursive least squares algorithm, or a combination thereof based on the output from the second adder and the whitened frequency domain reference signal to adjust the coefficients of the adaptive filter.

12. The system according to claim 9, wherein the module includes a double-talk detector to control the adaptation process of the adaptive filter.

13. The system according to claim 9, wherein the module controls the adaptation step size of each adaptive filter.

14. The system according to claim 9, further comprising a non-adaptive noise reduction module for eliminating uncorrelated noise.

15. The system according to claim 9, wherein the processing module includes a cross talk resistant adaptive processing module having a pair of adaptive filters in each subband, which process the frequency domain primary signal and frequency domain reference signal.

16. The system according to claim 9, wherein the undesirable signal is an echo signal or a noise signal.

17. A method according to claim 1, wherein the analysing step performs a weighted overlap-added (WOLA) analysis, and the synthesizing step performs a WOLA synthesis.

18. A method according to claim 17, wherein the analysing step includes the steps of:
    performing WOLA analysis on the primary signal in a time domain to provide the frequency domain primary signals; and
    performing WOLA analysis on the reference signal in the time domain to provide the frequency domain reference signals.

19. A system according to claim 9, wherein the analysis filterbank includes a weighted overlap-added (WOLA) analysis filterbank, and the synthesis filterbank includes a WOLA synthesis filterbank.

20. A system according to claim 19, wherein the analysis filterbank includes:
    a first WOLA analysis filterbank for providing the frequency domain primary signals; and
    a second WOLA analysis filterbank for providing the frequency domain reference signals.

21. A method according to claim 1, wherein the steps of whitening comprises:
    whitening each of the frequency domain primary signal and the frequency domain reference signal by spectral emphasis.

22. A method according to claim 1, wherein the steps of whitening comprises:
    whitening each of the frequency domain primary signal and the frequency domain reference signal by decimating each of the frequency domain primary signal and the frequency domain reference signal by a factor which is less than or equal to an oversampling factor (OS).

23. A system according to claim 9, wherein the means for whitening comprises:
    means for whitening each of the frequency domain primary signal and the frequency domain reference signal by spectral emphasis.

24. A system according to claim 9, wherein the means for whitening comprises:
    means for whitening each of the frequency domain primary signal and the frequency domain reference signal by decimating each of the frequency domain primary signal and the frequency domain reference signal by a factor which is less than or equal to an oversampling factor (OS).

* * * * *